(12) United States Patent
Nakagawa

(10) Patent No.: US 8,258,989 B2
(45) Date of Patent: Sep. 4, 2012

(54) DATA DEMODULATOR, DATA DEMODULATION METHOD AND PROGRAM THEREOF

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 77 days.

(21) Appl. No.: 12/905,402

(22) Filed: Oct. 15, 2010

(65) Prior Publication Data
US 2011/0095921 A1    Apr. 28, 2011

(30) Foreign Application Priority Data
Oct. 23, 2009    (JP) ................................ P2009-244752

(51) Int. Cl.
*H03M 7/00* (2006.01)
(52) U.S. Cl. ................................ 341/59; 341/58; 341/68
(58) Field of Classification Search ..................... 341/58, 341/59, 68
See application file for complete search history.

(56) References Cited

U.S. PATENT DOCUMENTS

| | | | |
|---|---|---|---|
| 5,506,581 A * | 4/1996 | Ino et al. ........................ | 341/58 |
| 5,742,243 A * | 4/1998 | Moriyama ........................ | 341/59 |
| 6,577,255 B2 * | 6/2003 | Hayami et al. .................. | 341/59 |
| 7,200,175 B2 * | 4/2007 | Nakagawa et al. ............ | 375/253 |
| 7,321,320 B2 * | 1/2008 | Shine .............................. | 341/58 |

FOREIGN PATENT DOCUMENTS
JP    11-177431    7/1999

OTHER PUBLICATIONS

U.S. Appl. No. 13/108,208, filed May 16, 2011, Nakagawa.

* cited by examiner

*Primary Examiner* — Khai M Nguyen
(74) *Attorney, Agent, or Firm* — Oblon, Spivak, McClelland, Maier & Neustadt, L.L.P.

(57) ABSTRACT

A data demodulator includes: a conversion means for converting an RLL code obtained by converting data in which information bits including specific bits are inserted at fixed intervals which is included in an input signal in accordance with a modulation table having variable-length conversion rules into data in accordance with a demodulation table corresponding to the modulation table; a determination means for determining control segments for performing calculation intended by the information bits from the converted data; a calculation means for executing calculation intended by the specific bit inserted in the control segment different from a calculation target with respect to the data of the control segment as the calculation target; and a correction output means for selecting one of first data converted by the conversion means and second data obtained by converting the RLL code of the input signal corrected based on the calculation result in accordance with the demodulation table and outputting the data.

20 Claims, 15 Drawing Sheets

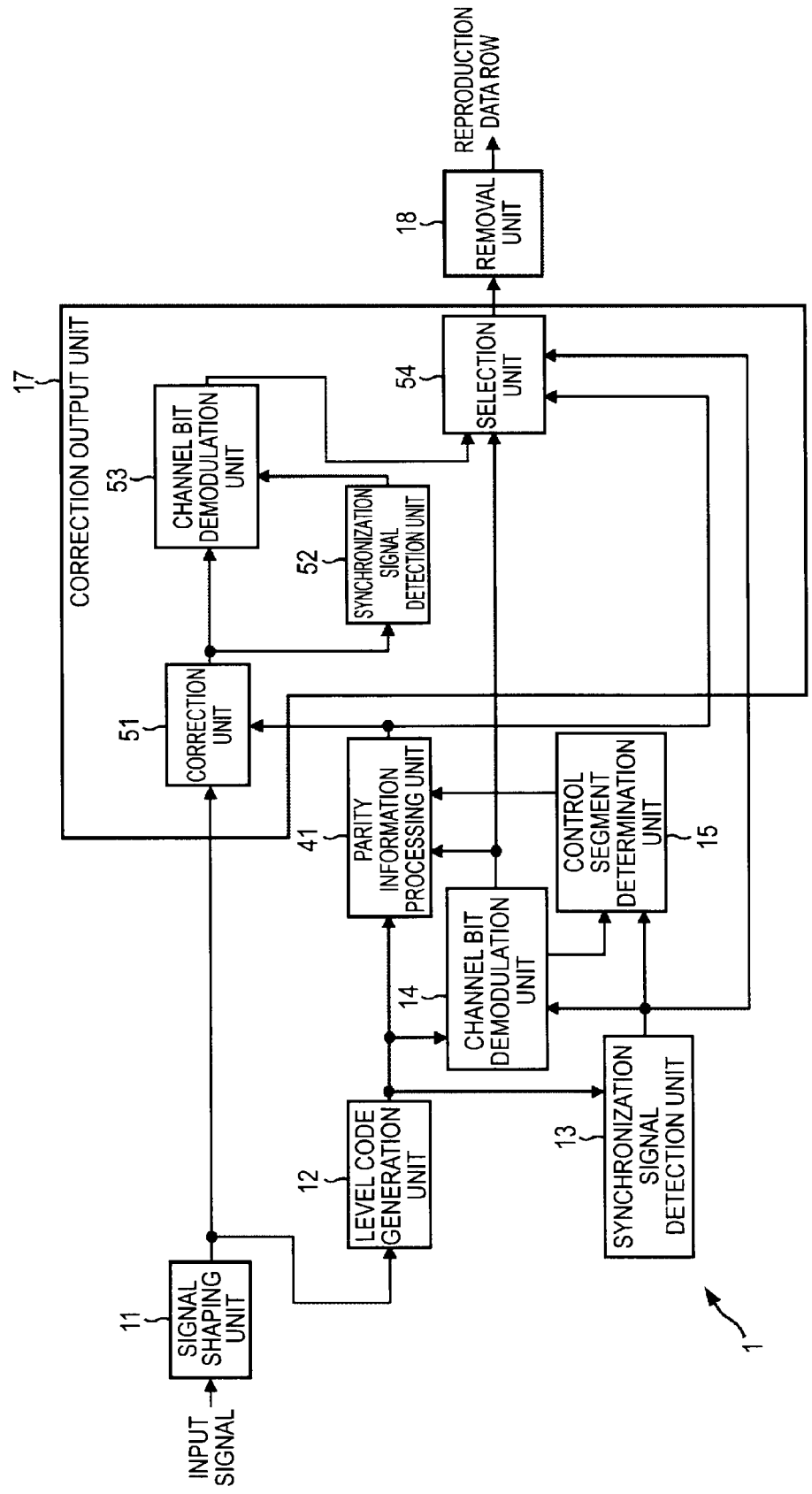

DATA DEMODULATOR, DATA DEMODULATION METHOD AND PROGRAM THEREOF

BACKGROUND OF THE INVENTION

1. Field of the Invention

The present invention related to a data demodulator, a data demodulation method and a program thereof, and particularly relates to a data demodulator, a data demodulation method and a program capable of allowing recording/reproducing characteristics to be more stable.

2. Description of the Related Art

When data is transmitted to a given transmission line or recorded in recording media, for example, a magnetic disc, an optical disc, a magneto-optic disc and so on, data is modulated so as to be suitable for the transmission line or recording media. As one of such modulation methods, block coding is known. In the block coding, a data row is divided into blocks in a unit of "mxi" bits (referred to as a data word in the following description) and the data word is converted into a code word of "nxi" bits in accordance with a suitable code law. The bit of the code word is also referred to as a channel bit in the following description. In this coding, the code will be a fixed length code when i=1, and the code will be a variable length code when plural "i"s can be selected, that is, when a given "i" is selected from a range of 1 to "i max" (maximum i) to perform conversion. The code to which the block coding has been performed is represented by a variable length code (d, k; m, n;r).

Here, "i" is referred to as a constraint length and "i max" is represented by "r" (maximum constraint length). Additionally, "d" represents, for example, the minimum number of continuing "0"s entering between continuing "1"s, namely, the minimum run of "0", and "k" represents the maximum number of continuing "0"s entering between continuing "1"s, namely, the maximum run of "0".

In the case of recording the cord words obtained as described above in the optical disc, the magneto-optic disc and so on, an NRZI (NonReturn to Zero Inverted) modulation in which the waveform is inverted at "1" and is not inverted at "0" is performed by a variable-length code row to perform recording based on the variable length code to which the NRZI modulation has been performed (referred to as a recording waveform row in the following description), for example, in a compact disc (CD) and a minidisc (MD) (Trademark). This is called mark edge recording. On the other hand, in the magneto-optic disc of 3.5 inch/230 MB capacity in an ISO standard and the like, a code row to which recoding modulation has been performed is directly recorded without NRZI modulation. This is called mark position recording. The mark edge recording is often used in recording media having high recording density at present.

When the minimum inversion interval of the recording waveform row is Tmin and the maximum inversion interval is Tmax, it is preferable that the minimum inversion interval Tmin is longer, namely, the minimum run "d" is higher for performing the high-density recording in the linear velocity direction and it is preferable that the maximum inversion interval Tmax is shorter, namely, the maximum run "k" is lower for performing reproduction of a clock. It is also preferable that Tmax/Tmin are lower when considering overwrite characteristics. Various modulation methods have been further proposed and practiced while checking conditions of media such that it is important that the detection window width Tw=m/n is wide in terms of Jitter or S/N.

Here, modulation methods which have been proposed or practically used in the optical disc, the magnetic disc, or the magneto-optic disc and so on will be specifically cited. EFM code (also written as (2,10;8,17;1)) used in CD or MD and 8-16 code (also written as (2,10;1,2;1)) used in DVD (Digital Versatile Disc) and RLL(2,7) (also written as (2,7;m,n;r) used in PD (120 mm 650 MB capacity) are RLL codes in which the minimum run d=2. Additionally, RLL (1, 7) (also written as (1,7;2,3;r)) used in MD-DATA2 or 3.5 inchMO (640 MB capacity) in an ISO standard is an RLL code in which the minimum run d=1. Furthermore, the RLL code (Run Length Limited code) having the minimum run of d=1 is often used, in which the size of the minimum mark and conversion efficiency are well balanced in a recording/reproducing disc apparatus for the optical disc, the magneto-optic disc and the like having high recording density which is currently under development and study.

A modulation table of the variable length RLL (1,7) code is a table, for example, shown as follows:

TABLE 1

RLL(1, 7): (d, k; m, n; r) = (1, 7; 2, 3; 2)

| | data pattern | code pattern |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

A sign "x" in the modulation table indicates "1" when a subsequent channel bit is "0", and indicates "0" when a subsequent channel bit is "1". The maximum constraint length "r" is 2.

Parameters of the variable length RLL (1,7) are (1,7;2,3,2), and when a bit interval of the recording waveform row is T, the minimum inversion interval Tmin represented by (d+1)T is 2(=1+1)T. When the bit interval of the data row is Tdata, the minimum inversion interval Tmin represented by (m/n)×2 will be 1.33(=(⅔)×2)Tdata. The maximum inversion interval Tmax represented by (k+1)T will be Tmax=8(=7+1)T(=(m/n)×8Tdata=(⅔)×8Tdata=5.33Tdata). Furthermore, the detection window width Tw is represented by (m/n)×Tdata, and a value thereof will be Tw=0.67(=⅔)Tdata.

In a channel bit row to which the modulation by the RLL (1,7) of Table 1 has been performed, generation frequency of 2T is the most frequent which is Tmin, and the order of frequency will be 3T, 4T, 5T, 6T . . . . A case in which 2T as the minimum run is repeated, that is, the case in which a lot of edge information is generated in early cycle is advantageous in clock reproduction in many cases.

However, when the recording linear density is further increased in recording/reproducing of, for example, an optical disc, the minimum run will be at a portion where an error is liable to occur. Because a waveform output of the minimum run is lower than other runs at the time of reproducing a disc and is liable to be affected by, for example, defocus, tangential tilt and the like. Furthermore, recording/reproducing of continuing minimum marks in the high recording linear density is liable to be affected by disturbance such as noise, therefore, reproduction errors of data are liable to occur. As a pattern of the reproduction errors of data at this time, a case in which all continuing minimum marks from the head edge to the last edge are shifted and fail all at once. That is, the bit error length to be generated is propagated from the head to the last in a segment in which the minimum runs continue. Accordingly, there arises a problem that the error propagation length will be longer.

For stabilization at the time of recording/reproducing data with high linear density, it is effective to set limits on continuity of the minimum runs.

On the other hand, at the time of recording data in a recording medium or transferring data, coding modulation suitable for the recording medium or a transmission line is performed. When low frequency components are included in these modulated codes, variation is liable to occur in various types of error signals such as a tracking error in servo control of a disc apparatus or jitter is liable to occur. Therefore, it is desirable that low frequency components are suppressed in modulation codes.

As a method of suppressing low frequency components, there is DSV (Digital Sum Value) control. DSV means the total sum calculated by NRZI modulating the channel bit row (namely, level coding) to obtain a recording code row and allowing "1" in the bit row (symbol of data) to be "+1" and allowing "0" to be "−1". The DSV will be the measure of low frequency components of the recording code row. To decrease absolute values of variation of positive and negative in the DSV, namely, to perform the DSV control leads to removal of DC components of the recording code row and suppression of low frequency components.

The DSV control is not performed in the modulation codes by the variable length RLL (1,7) table shown in the Table 1. The DSV control in this case is realized by performing the DSV calculation at given intervals in the coding row (channel bit row) after modulation and given DSV bits are inserted into the coding row (channel bit row) (for example, refer to JP-A-11-177431 (Patent Document 1)).

The number of DSV bits inverted into the channel bit row is determined by the minimum run "d". When the DSV bit is inserted in an arbitrary position in the code word so as to secure the minimum run under the condition that d=1, the necessary number of bits is 2(=d+1)-channel bit. The necessary number of bits when the DSV bit is inserted in an arbitrary position in the code word so as to secure the maximum run is 4(=2×(d+1))-channel bit. When the DSV control is performed with the number of channel bits lower than the above, it may be difficult to perform the DSV control depending on adjacent patterns between which the DSV bit is sandwiched.

In the RLL (1,7) code in which (d,k;m,n)=(1,7;2,3), when the DSV bit is converted into data with the conversion rate:
4-channel bit×⅔=8/3=equivalent of 2.67 data (2.67 Tdata).

The DSV bit is a basically a redundant bit. Therefore, it is preferable that the number of DVS bits is reduced as small as possible from the viewpoint of efficiency of coding conversion.

Furthermore, it is preferable that the minimum run "d" and the maximum run "k" do not vary according to the DSV bit to be inserted. This is because variation of (d,k) affects the recording/reproducing characteristics.

In the actual RLL code, it is necessary that the minimum run is inevitably secured as it has a significant impact on recording/reproducing characteristics, however, the maximum run is not always secured. There exists a format using a pattern breaking the maximum run as a synchronization pattern in some cases. For example, the maximum run in 8-16 code of the DVD (Digital Versatile Disc) is 11T, however, 14T which exceeds the maximum run is given in a synchronization pattern portion to thereby increase the detection performance of the synchronization pattern.

SUMMARY OF THE INVENTION

Even when the DSV control is prescribed by the format, there is a case in which the DSV control is not necessary according to the system. When the suppression of DC components is not necessary with respect to the format predetermined as a system, the bits for the DSV control inserted at given intervals will be redundant bits.

When the suppression of DC components is necessary and when the suppression of DC components is performed more than necessary with respect to the format predetermined as a system, it can be considered that the bits for the DSV control inserted at given intervals are the redundant bits.

In view of the above, it is desirable to allowing recording/reproducing characteristics to be more stable while using a predetermined format.

According to an embodiment of the invention, there is provided a data demodulator including a conversion means for converting an RLL code obtained by converting data in which information bits including specific bits are inserted at fixed intervals which is included in an input signal in accordance with a modulation table having variable-length conversion rules into data in accordance with a demodulation table corresponding to the modulation table, a determination means for determining control segments for performing calculation intended by the information bits from the converted data, a calculation means for executing calculation intended by the specific bit inserted in the control segment different from a calculation target with respect to the data of the control segment as the calculation target and a correction output means for selecting one of first data converted by the conversion means and second data obtained by converting the RLL code of the input signal corrected based on the calculation result in accordance with the demodulation table and outputting the data.

The information bits may be DSV bits and parity bits as specific bits inserted instead of part of the DSV bits.

The determination means may determine a DSV control segment and a parity calculation segment as the control segments, and the calculation means may execute parity calculation intended by the parity bit inserted in the parity calculation segment which is subsequent to the parity calculation segment as the calculation target with respect to the data of the parity calculation segment as the calculation target and may compare the parity bit with a value obtained by parity calculation.

The correction output means may include a correction means for correcting the input signal based on the calculation result by the calculation means, another conversion means for converting the RLL code of the corrected input signal into the second data in accordance with the demodulation table and a selection means for selecting the first data converted by the conversion means and the second data converted by the another conversion means.

The data demodulator may further include a detection means for detecting identification information indicating that the parity bits are inserted instead of part of the DSV bits from the input signal.

The data demodulator may further include a DSV calculation means for performing DSV calculation based on the DSV bits.

The data demodulator may further include a judgment means for judging that the parity bits are inserted instead of part of the DSV bits from probability that the comparison result occurs.

The data demodulator may further include a DSV calculation means for calculating a DSV of the DSV control segment, in which the judgment means judges that the parity bits are inserted further by using the result of DSV calculation.

The determination means may determine the DSV control segment and the parity calculation segment from a breakpoint between a last bit of a data pattern immediately preceding to the information bit on the basis of the information bit inserted in the data and a subsequent bit.

The data demodulator may further include a removal means for removing redundant bits from data selected by the selection means.

According to the embodiment of the invention, there also is provided a data demodulation method of a data demodulator having a conversion means, a determination means, a calculation means and a correction output means, which includes the steps of converting an RLL code obtained by converting data in which information bits including specific bits are inserted at fixed intervals which is included in an input signal in accordance with a modulation table having variable-length conversion rules into data in accordance with a demodulation table corresponding to the modulation table by the conversion means, determining control segments for performing calculation intended by the information bits from the converted data by the determination means executing calculation intended by the specific bit inserted in the control segment different from a calculation target with respect to the data of the control segment as the calculation target by the calculation means and selecting one of first data converted by the conversion means and second data obtained by converting the RLL code of the input signal corrected based on the calculation result in accordance with the demodulation table and outputting the data by the correction output means.

According to the embodiment of the invention, there is further provided a program allowing a computer to function as a conversion means, a determination means, a calculation means and a correction output means, in which the conversion means converts an RLL code obtained by converting data in which information bits including specific bits are inserted at fixed intervals which is included in an input signal in accordance with a modulation table having variable-length conversion rules into data in accordance with a demodulation table corresponding to the modulation table, the determination means determines control segments for performing calculation intended by the information bits from the converted data, the calculation means executes calculation intended by the specific bit inserted in the control segment different from a calculation target with respect to the data of the control segment as the calculation target and the correction output means selects one of first data converted by the conversion means and second data obtained by converting the RLL code of the input signal corrected based on the calculation result in accordance with the demodulation table and outputs the data.

According to the embodiment of the invention, the conversion means converts an RLL code obtained by converting data in which information bits including specific bits are inserted at fixed intervals which is included in an input signal in accordance with a modulation table having variable-length conversion rules into data in accordance with a demodulation table corresponding to the modulation table, the determination means determines control segments for performing calculation intended by the information bits from the converted data, the calculation means executes calculation intended by the specific bit inserted in the control segment different from a calculation target with respect to the data of the control segment as the calculation target and the correction output means selects one of first data converted by the conversion means and second data obtained by converting the RLL code of the input signal corrected based on the calculation result in accordance with the demodulation table and outputs the data.

According to another embodiment of the invention, there is provided a data demodulator including a conversion means for converting a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table, a specific bit calculation means for executing calculation intended by the specific bits and a DSV calculation means for executing DSV calculation based on the DSV bits.

The specific bit may be a parity bit.

The data demodulator may further include a judgment means for judging that the parity bits are inserted instead of part of the DSV bits by using the result of the DSV calculation.

The data demodulator may further include a determination means for determining control segments for performing calculation intended by the information bits from the converted data and a selection means for selecting one of first data converted by the conversion means and second data obtained by converting the code of the input signal corrected based on the calculation result of the specific bit in accordance with the demodulation table, in which the specific bit calculation means may execute calculation intended by the specific bit inserted in the control segment different from a calculation target with respect to the data of the control segment of the calculation target.

According to another embodiment of the invention, there is also provided a data demodulation method of a data demodulator having a conversion means, a specific bit calculation means and a DSV calculation means, which includes the steps of converting a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table by the conversion means, executing calculation intended by the specific bits by the specific bit calculation means and executing DSV calculation based on the DSV bits by the DSV calculation means.

According to another embodiment of the invention, there is further provided a program allowing a computer to function as a conversion means, a specific bit calculation means and a DSV calculation means, in which the conversion means converts a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table, the specific bit calculation means executes calculation intended by the specific bits and the DSV calculation means executes DSV calculation based on the DSV bits.

According to another embodiment of the invention, the conversion means converts a code obtained by converting data in which information bits including DSV bits and specific bits having given intention instead of part of the DSV bits are inserted at fixed intervals which is included in an input signal in accordance with a modulation table into data in accordance with a demodulation table corresponding to the modulation table, the specific bit calculation means executes calculation intended by the specific bits and the DSV calculation means executes DSV calculation based on the DSV bits.

As described above, it is possible to allow recording/reproducing characteristics to be more stable according to the embodiment of the invention.

BRIEF DESCRIPTION OF THE DRAWINGS

FIG. 5 is a block diagram showing a configuration of the data demodulator according to an embodiment of the invention;

DESCRIPTION OF THE PREFERRED EMBODIMENTS

Figure 1:
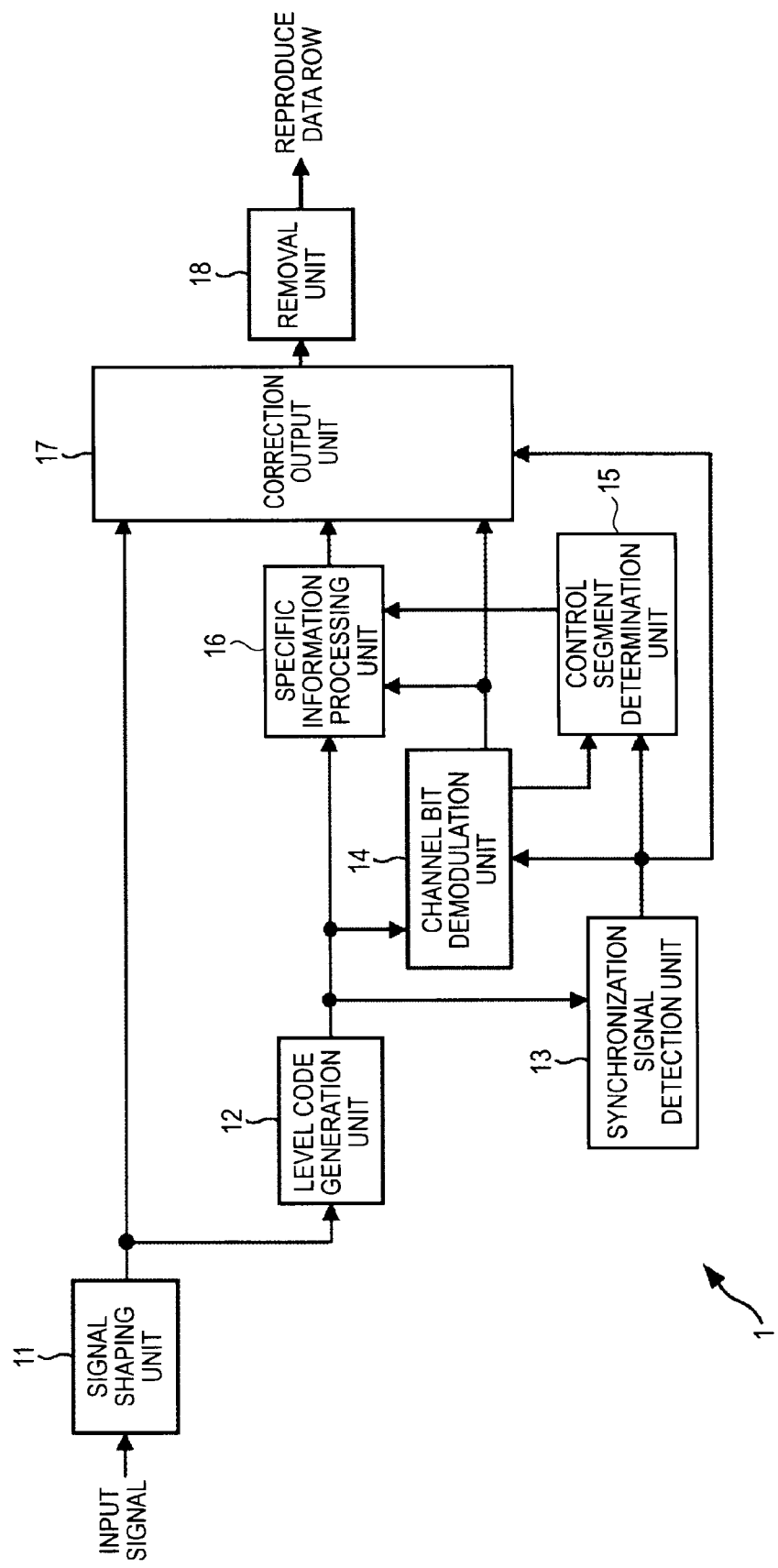
FIG. 1 is a block diagram showing a configuration of a data demodulator according to an embodiment of the invention.

Hereinafter, modes for carrying out the invention (referred to as embodiment in the following description) will be explained. The explanation is made in the following order.
1. First Embodiment
2. Second Embodiment
3. Third Embodiment
4. Fourth Embodiment

FIRST EMBODIMENT

Demodulation Table

A demodulation table used in an embodiment of the invention will be explained first.

Table 2 is a modulation table of a modulation method of 1.7PP code corresponding to further higher recording density as compared with the modulation method of Table 1. A data modulator converts a data pattern into a code pattern in accordance with the modulation table. On the other hand, a data demodulator converts the data pattern into the code pattern using the table which is substantially the same as the modulation table as a demodulation table. Therefore, the modulation table of Table 2 doubles as the demodulation table.

TABLE 2

| 1, 7PP: (d, k; m, n; r) = (1, 7; 2, 3; 4) | |
|---|---|
| data pattern | code pattern |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next010) |
| 00001000 | 000 100 100 100 |
| 00000000 | 010 100 100 100 |
| if xx1 then *0* = 000 | |
| xx0 then *0* = 101 | |
| ======================= | |
| Sync & Termination | |
| #01 001 000 000 001 000 000 001 (24 channel bits) | |
| # = 0 not terminate case | |
| # = 1 terminate case | |
| Termination table | |
| 00 | 000 |
| 0000 | 010 100 |
| 110111 | 001 000 000 (next010): |
| When next channel bits are "010", | |
| convert '11 01 11" to "001 000 000" | |

The modulation table of Table 2 includes, as conversion patterns, basic patterns which are indispensable for conversion processing (conversion patterns including data patterns from (11) to (000000)), displacement patterns which realize more efficient conversion processing when being used, though conversion processing is possible without these patterns (conversion patterns including data patterns (110111), (00001000) and (00000000) and termination patterns for terminating a data row at an arbitrary position (conversion patterns including data patterns of (00) and (0000).

Table 2 includes an indeterminate code (a code represented by "*") as an element of the basic patterns with the minimum run d=1 and the maximum run k=7. The indeterminate code is determined to be "0" or "1" so as to secure the minimum run "d" and the maximum run "k" regardless of immediately preceding and immediately subsequent code word rows. That is, in Table 2, when a 2-data pattern to be converted is (11), a code pattern "000" or "101" is selected according to the preceding code word row (channel bit row), and the data pattern is converted into either of them. For example, when the 1-channel bit of the preceding code word row is "1", the data pattern (11) is converted into the code pattern "000" for securing the minimum run "d", and when the 1-channel bit of the preceding code word row is "0", the data pattern (11) is converted into the cord pattern "101" for securing the maximum run "k".

The basic pattern of the modulation table in Table 2 has a variable-length structure. That is, the basic pattern in the constraint length "i"=1 includes 3 bits (*0*, 001, 010) which are smaller than the necessary number, namely, 4 bits (2^m=2^2=4). As a result, there exists a data row which is difficult to be converted only by the constraint length "i"=1 when converting the data row. In the event, in order to convert all data rows in Table 2 (in order to be approved as the modulation table), it is necessary to refer to basic patterns to the constraint length "i"=3.

The modulation table of Table 2 includes displacement patterns which limit the continuity of the minimum run "d", therefore, when the data pattern is (110111), a further subsequent code word row is referred, and when the code word row is "010", it is converted into the 6-data pattern code pattern "001 000 000". The data pattern is converted into code patterns in 2-data units ((11), (01), (11)) when the subsequent code word row is not "010", therefore, it is converted into code words "*0* 010 *0*". Accordingly, in the code word row obtained by converting data, the continuity of the minimum run is limited and the repetition of the minimum run is six times at the maximum.

In the modulation table of Table 2, the maximum constraint length "r=4". The conversion pattern of the constraint length "i=4" includes displacement patterns (the maximum run guarantee patterns) for realizing the maximum run k=7. That is, a data pattern (00001000) is converted into a code pattern "000 100 100 100" and a data pattern (00000000) is converted into a code pattern "010 100 100 100". Also in this case, the minimum run d=1 is secured.

Additionally, in Table 2, in the case that the data row is terminated at an arbitrary position for sandwiching the synchronization pattern, when the data row is terminated at a position (00) or (0000), the termination pattern is used. In the synchronization pattern to be inserted, a head cord word is a bit for identifying use of the termination pattern, and when the termination pattern is used, the head cord word of the immediately subsequent synchronization pattern row is "1". When the termination pattern is not used, the head cord word is "0". In the synchronization pattern in Table 2, the above bit for identifying use of the termination pattern and a code pattern of k=8 which exceeds the maximum run k=7 is repeated twice for detecting the synchronization pattern, which are 24 cord words in total.

The conversion patterns of Table 2 have a conversion rule in which a remainder obtained when the number of "1"s as elements of the data pattern is divided by 2 and a remainder obtained when the number of "1"s as elements of the code pattern to be converted is divided by the 2 are the same, which is "1" or "0". That is, the patterns of Table 2 has the conversion rule in which the number of "1"s will be an odd number or an even number in all corresponding elements. That is, Table 2 has a parity conservation pattern in the relation between data before conversion and codes after conversion. For example, a data pattern (000001) in the conversion patterns corresponds to a code pattern (010 100 100), and the number of "1"s as respective elements is one in the data pattern and three in the corresponding code pattern, which correspond to each other in a point that the remainder when divided by 2 is 1 (odd number). Similarly, a data pattern (000000) corresponds to a code pattern (010 100 000) and the number of "1"s is zero in the data pattern and two in the corresponding code pattern, which correspond to each other in a point that the remainder when divided by 2 is "0" (even number).

Next, a method of performing the DSV control will be described. The related art DSV control in the case that the DSV control is not performed to the modulation table such as the RLL (1,7) codes of Table 1 is performed by, for example, adding at least (d+1) bits as the DSV bits at given intervals to the modulated channel bit row after modulating the data row. The DSV control similar to related art can be performed also in the modulation table of Table 2, and further efficient DSV control can be realized by taking advantage of the relation between the data patterns and the code patterns in Table 2. That is, the modulation table has the conversion rules in which remainders obtained when the number of "1"s as elements of the data pattern and the number of "1"s as elements of the code pattern are respectively divided by 2 are the same, which is "1" or "0". At this time, to insert a DSV bit of "1" indicating "inversion" of a DSV bit or a DSV bit of "0" indicating "non-inversion" into the channel bit row will be equivalent to insert the DSV bit of "1" when "inverted" or the DSV bit of "0" when "not inverted" into the data bit row, respectively.

For example, in Table 2, in the case that the DSV bit is inserted after data of 3 bits to be converted continues as (001), the data will be (001x) ("x" is 1-bit and "0" or "1"). When "0" is given to "x", the following conversion is made according to the modulation table of Table 2.

| Data pattern | Code pattern |
|---|---|
| 0010 | 010 000 |

When "1" is given to "x", the following conversion is made.

| Data pattern | Code pattern |
|---|---|
| 0011 | 010 100 |

Level code rows are generated by performing the NRZI modulation to the code word rows, these patterns will be as follows.

| Data pattern | Code pattern | Level code row |
|---|---|---|
| 0010 | 010 000 | 011111 |
| 0011 | 010 100 | 011000 |

The last 3 bits in the level code rows are inverted to each other. This means that the DSV control can be performed also in the data row by selecting "1" or "0" of the DSV bit "x".

Considering the redundancy by the DSV control, to perform the DSV control by 1-bit in the data row is equivalent to perform the DSV control by 1.5-channel bits according to the conversion rate of Table 2 (m:n=2:3) when expressed by the channel bit row. On the other hand, in order to perform the DSV control in the RLL (1,7) table like Table 1, it is necessary to perform the DSV control in the channel bit row. For securing the minimum run in this case, at least 2 channel bits are necessary, which further increases the redundancy as compared with the DSV control of Table 2. In other words, it is possible to perform the DSV control efficiently by performing the DSV control in the data row when possessing the table structure of Table 2.

The variable-length table like Table 2 which responds to the high recording density and has the minimum run and the maximum run of (d,k)=(1,7) is applied as a format in, for example, Blu-ray Disc ReWritable ver1.0 (Trademark), which is a high-density optical disc system.

Then, in the days ahead, a further stable system is requested also in a conversion method between data and channel bits with respect to further higher recording density, specifically for example, further higher density standards for the high density optical disc.

In such case, when the variable-length table applied to, for example, Blu-ray Disc ReWritable ver1.0 which has been already commercialized is used to thereby realize the further stable system, the related art design technique can be appropriated, therefore, design risk at the time of designing hardware can be reduced.

As described above, when the modulation table of Table 2 will be the demodulation table when used for converting codes into data. In the embodiments of the invention, the demodulation table is used.

[Configuration of a Data Demodulator]

FIG. 1 is a block diagram showing a configuration of a data demodulator according to an embodiment of the invention.

A data demodulator 1 includes a signal shaping unit 11, a level code generation unit 12, a synchronization signal detection unit 13, a channel bit demodulation unit 14, a control segment determination unit 15, a specific information processing unit 16, a correction output unit 17 and a removal unit 18.

The signal shaping unit 11 inputs a signal transmitted from a not-shown given transmission line, namely, the signal reproduced by a given recording medium or transmitted through networks such as Internet and a LAN (local area network) and performs shaping processing of the input signal. The shaping processing can be performed by, for example, an analog equalizer, a FIR (Finite Impulse Response) filter through A/D conversion and the like. The waveform of the analog signal is shaped by the processing.

The level code generation unit 12 digitalizes the signal in an analog level or in a digital level of plural steps which has been A/D converted into, for example, "0" and "1", outputting a channel bit row which is a level code. For example, binary conversion performed by comparing the signal with a given threshold or binary conversion performed by maximum likelihood detection by methods such as Viterbi algorithm is performed.

The synchronization signal detection unit 13 detects a synchronization signal inserted at given intervals (namely, the synchronization pattern of 24-bit in Table 2) in a given position of the channel bit row outputted by the level code generation unit 12. The channel bit demodulation unit 14, the control segment determination unit 15 and the correction output unit 17 synchronize respective processing based on the synchronization signal.

In the case of the embodiment, a recording code row recorded in a recording medium which is the input signal is generated by inserting specific information in a data row. Specifically, the data row is generated by inserting one information bit in every 45 pieces of data. The information bits are bits for given calculation, and normally, DSV bits for DSV calculation, however, part of the DSV bits may be replaced with specific bits as specific information according to need. For what purpose the specific bits are used is optional, and for example, a bit can be used for calculation of error detection.

When the specific bit is inserted, identification information indicating the insertion can be arranged in a synchronization signal block. In this case, for example, the synchronization signal block is formed by 30 bits in which 6 additional bits are added to the 24-bit synchronization pattern. The identification information indicating that the channel bit row includes the specific bit is formed by the pattern of 6 additional bits. The synchronization signal detection unit also detects the identification information. The synchronization signal detection unit 13 constitutes a detection means for detecting identification information indicating that parity bits are inserted instead of part of DSV bits from the input signal.

According to the additional information described above, a configuration of the DSV bit and the parity bit having a more complicated order such as shown as follows can be realized.

DSV bit-parity bit-parity bit-DSV bit-parity bit-parity bit-DSV bit . . . .

In this case, the rule is determined in advance on the side of an encoder (data modulator) and a decoder (data demodulator).

Moreover, a specific pattern concerning a method of control segmentation can be given as additional information. For example, as described above, a control breakpoint B can be set at a position immediately subsequent to a bit which is preceding to the information bit by the fixed number of bits on the basis of the information bit inserted to data. In this case, information based on the channel bits continuing after the fixed breakpoint can be applied as additional information. Accordingly, recording/reproducing processing can be performed more positively.

The channel bit demodulation unit 14 demodulates the channel bit row in accordance with the demodulation table of Table 2 having the variable-length structure and outputs the data row. At this time, the reverse NRZI modulation of the level code is performed according to need to generate an edge code. The channel bit demodulation unit 14 constitutes a conversion means for converting the RLL code obtained by converting data in which the information bits including the specific bits are inserted at fixed intervals included in the input signal in accordance with the modulation table having the variable-length conversion rule into data in accordance with the demodulation table corresponding to the modulation table.

The control segment determination unit 15 detects the breakpoint of data conversion in accordance with a given format and determines a control segment based on the breakpoint. As Table 2 is a table having the variable-length structure, the control segment is variable. The control segment determination unit 15 constitutes a determination means for determining the control segment for performing calculation intended by the information bit based on the converted data.

The specific information processing unit 16 takes out the specific bit inserted at a given position of the data row supplied from the channel bit demodulation unit 14 based on the control segment detected by the control segment determination unit 15. Then, the specific information processing unit 16 performs specific calculation corresponding to the specific bit by using the level code supplied from the level code generation unit 12. Moreover, the specific information processing unit 16 compares the result of performing specific calculation using the level code in the control segment with the previously embedded specific bit. For example, when the specific bit is the parity bit, the result of parity calculation using the level code in the control segment is compared with the parity bit. The specific information processing unit 16 constitutes a calculation means for executing calculation intended by the specific bit inserted in a control segment different from the calculation target with respect to the data in the control segment of calculation target.

The correction output unit 17 performs given correction processing when it is determined that correction processing is necessary in the control segment as a result of comparison between the specific calculation result and the specific bit. The given processing includes, for example, correction processing by a FIR filter having exclusively considered characteristics, processing of altering conditions of maximum likelihood detection, processing of altering conditions of digital PLL (Phase Locked Loop) and so on. On the other hand, it is determined that correction processing is not necessary, another given processing is performed. Another given processing includes, for example, processing of not performing processing, processing of performing processing other than the above processing. The correction output unit 17 constitutes a correction output means for selecting one of first data converted by the conversion means and second data obtained by converting the RLL code of the input signal corrected based on the calculation result in accordance with the demodulation table and outputting the data.

The removal unit 18 removes redundant bits inserted at given intervals. The redundant bits are, for example, the synchronization pattern block, the DSV control bit, the specific bit and the like.

Though not shown, a timing management unit is provided, which manages timing by generating a timing signal and supplying the signal to respective units.

[Reproducing Processing]

Next, reproducing processing of the data demodulator 1 of FIG. 1 will be explained.

Figure 2:
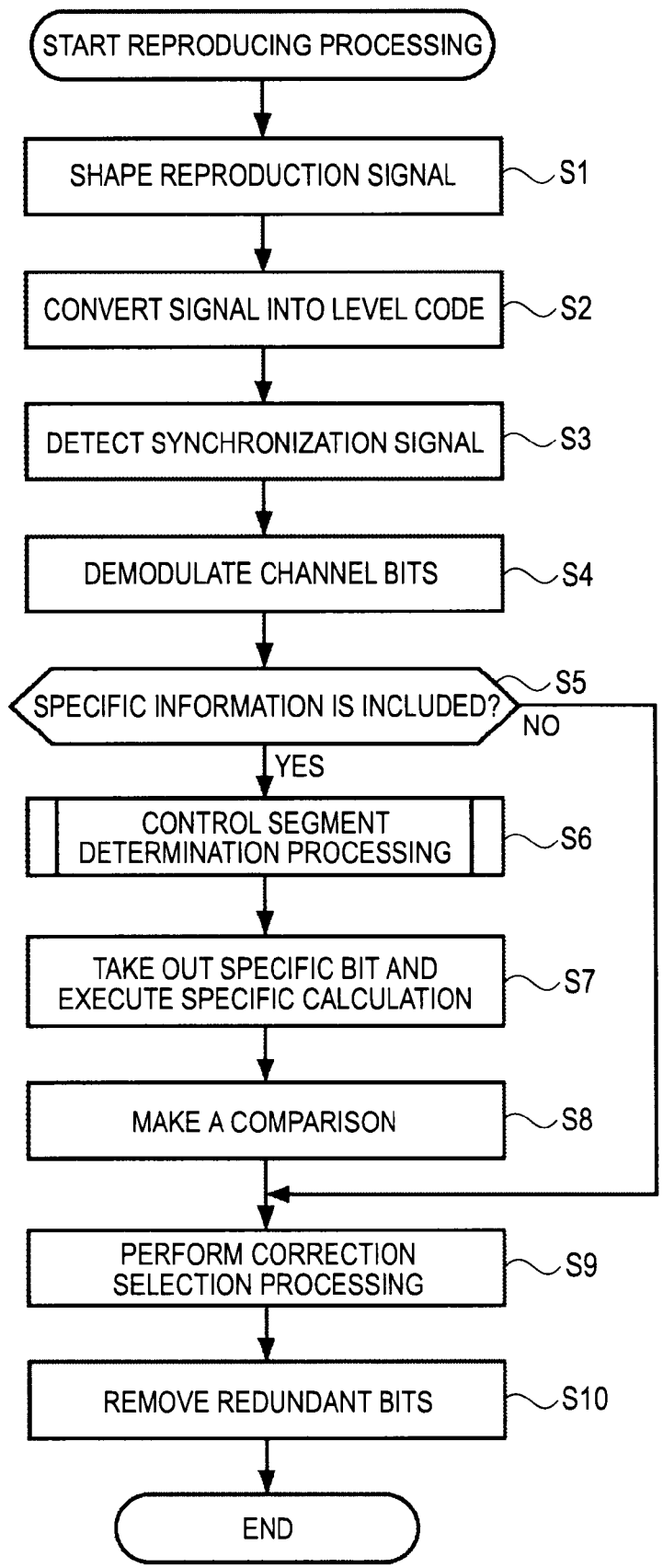
FIG. 2 is a flowchart for explaining reproducing processing.

FIG. 2 is a flowchart for explaining reproducing processing.

In Step S1, the signal shaping unit 11 shapes an inputted signal. The following digitalizing processing by the level code generation unit 12 can be positively performed by the processing.

In Step S2, the level code generation unit 12 converts the shaped signal to a level code. The signal is digitalized by the processing.

In Step S3, the synchronization signal detection unit 13 detects a synchronization signal from the level code, namely, the channel bit row. Specifically, the 24-channel bit synchronization pattern (#01 001 000 000 001 000 000 001) of Table 2 is detected. The synchronization pattern is inserted in a fixed cycle. Accordingly, the channel bit demodulation unit 14, the control segment determination unit 15 and the correction output unit 17 execute respective processing on the basis of the position of the synchronization pattern. The synchronization signal detection unit 13 also detects identification information in the synchronous signal block. The identification information represented by the 6-bit pattern excluding the 24-bit synchronous pattern in 30-bit synchronous signal block is a signal for identifying that the data row includes the specific bit. Accordingly, it is possible to determine whether the data row includes the specific bit or not from the identification information.

In Step S4, the channel bit demodulation unit 14 demodulates the channel bits generated by the level code generation unit 12 in Step S2. Specifically, the channel bits are converted into data in accordance with Table 2.

In Step S5, the synchronization signal detection unit 13 determines whether specific information is included or not based on the detected identification information. When the identification information indicates that the specific bit as specific information is included in the data row, the control segment determination unit 15 executes control segment determination processing in Step S6. The details of the processing is described later with reference to FIG. 3 and FIGS. 4A, 4B, and the control segments of the data row are determined by the processing.

In Step S7, the specific information processing unit 16 takes out the specific bit and executes specific calculation. When the specific bit is the parity bit, the parity bit is taken out, and the parity calculation of the control segment as calculation target is executed as the calculation corresponding to the parity bit, which has been determined by the control segment determination unit 15 in Step S6.

In Step S8, the specific information processing unit 16 makes a comparison. That is, the specific bit taken out in Step S7 is compared with the result of specific calculation performed in Step S7. When there is no error in the demodulation data, the specific bit corresponds to the result of specific calculation, and when there is an error in the demodulation data, the specific bit does not correspond to the result of specific calculation.

In Step S9, the correction output unit 17 performs correction selection processing. That is, the correction processing unit 17 performs correction processing such as equalizing processing to the signal shaped by the signal shaping unit 11 to generate the level code or the channel-bit type signal. The correction processing unit 17 further converts the signal into the data row in accordance with the demodulation table of Table 2. The correction output unit 17 selects one of the data row obtained by performing conversion by the unit itself and the data row demodulated by the channel bit demodulation unit 14 based on identification information detected by the synchronization signal detection unit 13.

In the case that the identification information indicates the insertion of the specific bit, when the comparison result do not correspond to the specific bit, data demodulated by the correction output unit 17 itself is selected. On the other hand, when the identification information indicates that the specific bit is not inserted as well as when the identification information indicates that the comparison result correspond to the specific bit though the identification information indicates the insertion of the specific bit, the data row demodulated by the channel bit demodulation unit 14 is selected. As described above, when there is an error, the data row demodulated from the correction signal is selected, therefore, data with lesser error can be outputted.

In Step S10, the removal unit 18 removes redundant bits. In the case of the embodiment, the DSV bit, the specific bit and the synchronization pattern block as redundant bits are removed from the data row, and the data row is outputted as a reproduction data row.

When it is determined that the specific information is not included in Step S5, it is difficult to perform comparison processing, therefore, the processing from Step S6 to Step S8 is skipped. In this case, the correction selection processing is executed in Step S9. The correction output unit 17 selects the data row demodulated by the channel bit demodulation unit 14 in Step S4. After that, the redundant bits are removed by the removal unit 18 in Step S10, and the data row is outputted as the reproduction data row.

[Control Segment Determination Processing]

Next, the details of the control segment determination processing of Step S6 in FIG. 2 will be explained with reference to FIG. 3 and FIGS. 4A, 4B.

Figure 3:
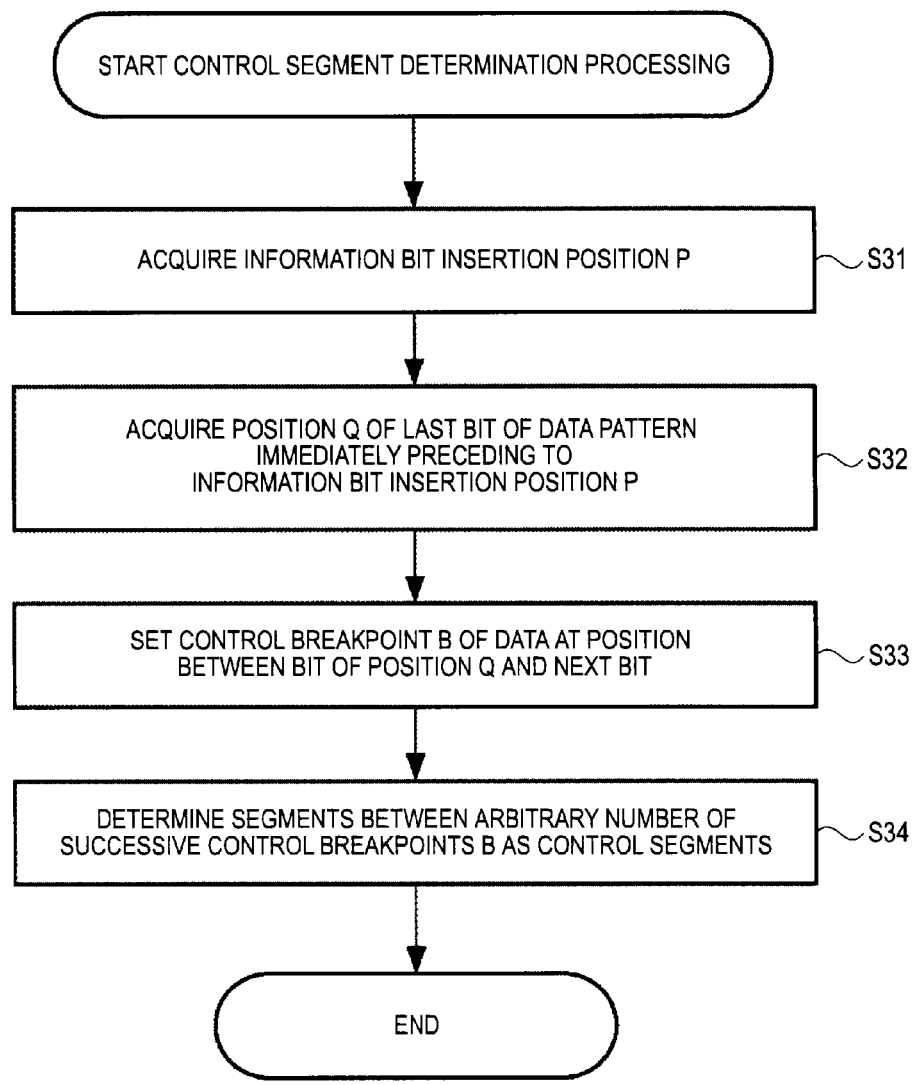
FIG. 3 is a flowchart for explaining control segment determination processing.

FIG. 3 is a flowchart for explaining the control segment determination processing.

In Step S31, the control segment determination unit 15 acquires an information bit insertion position P. In the case of the embodiment, one information bit is inserted in every 45 pieces of data, therefore, the position P can be acquired by counting the number of bits of data demodulated by the channel bit demodulation unit 14.

In Step S32, the control segment determination unit 15 acquires a position of the last bit Q of the data pattern immediately preceding to the information bit insertion position P. The data pattern immediately preceding to the insertion position P is a data pattern not including the information bit.

In Step S33, the control segment determination unit 15 determines the control breakpoint B of data at a position between the bit of the position Q and a next bit. That is, the position between the last bit of the data pattern immediately preceding to the information bit and the next bit is determined to be the control breakpoint B on the basis of the information bit inserted in the data.

In Step S34, the control segment determination unit 15 determines segments between the arbitrary number of successive control breakpoints B as control segments.

A specific example of the control segment determination processing will be further explained.

Figure 4A:
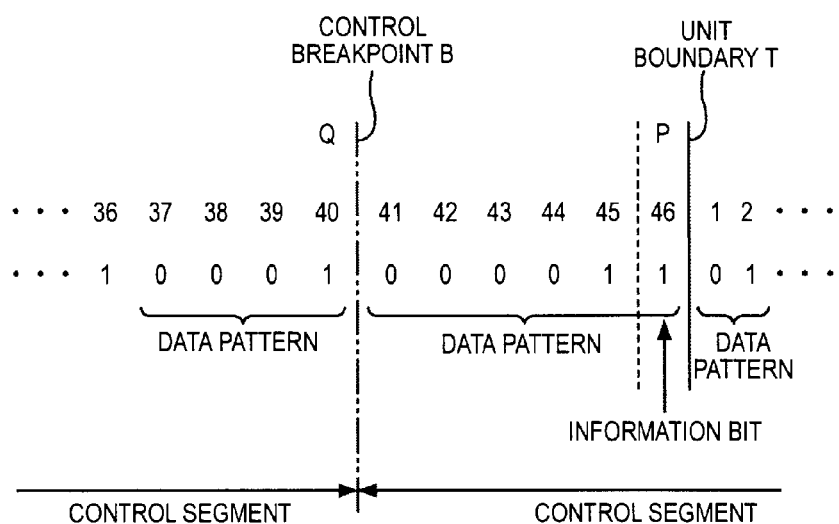
FIGS. 4A, 4B are views for explaining the control segment determination processing.
Figure 4B:
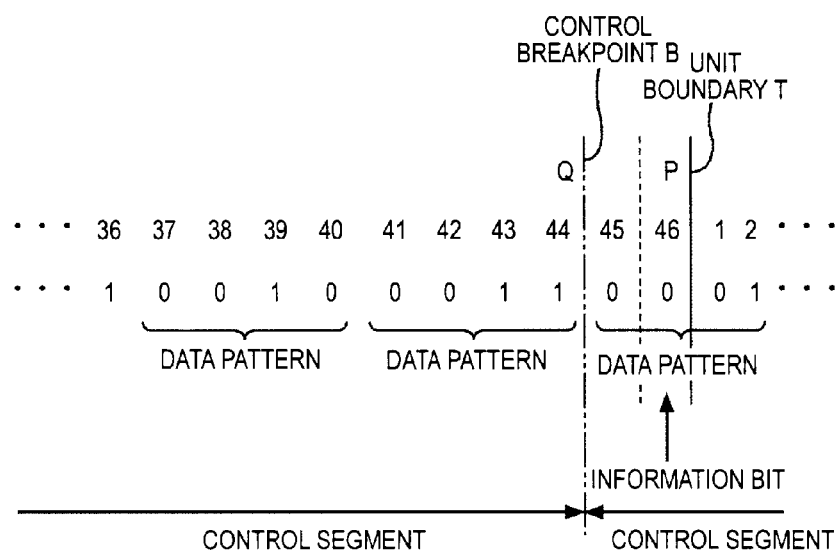

FIGS. 4A, 4B are views for explaining the control segment determination processing. The operation of inserting one information bit in every 45 pieces of data is repeated to generate the data row. That is, the data row is segmented by 45 pieces of data (45 bits) regarded as a unit and processing of inserting one information bit at a position immediately subsequent to 45 pieces of data (the first bit to the 45th bit are assigned to respective data) is repeated. Therefore, data obtained after inserting the information bit is data in the unit of 46-bit with a unit boundary T as the breakpoint, in which the information bit is inserted at the position P of the 46th data continued from 45 pieces of data.

As shown in Table 2, the number of bits of the data pattern is any of 2, 4, 6 and 8. In the example shown in FIG. 4A, 6 bits (000011) from the 41th bit to the 46th bit form the data pattern. However, the pattern includes the information bit of the 46th bit, therefore, the pattern is excluded from the data pattern immediately preceding to the insertion position P. The 4-bit data pattern (0001) started from the 37th bit to the 40th bit which is preceding to the data pattern (000011) is the data pattern immediately preceding to the insertion position P. Therefore, the position Q of the last bit of the data pattern immediately preceding to the insertion position P will be the position of the 40th bit.

In the example of FIG. 4A, the position between the 40th bit of the position Q and the 41th bit which is the next bit is determined as the control breakpoint B of data.

On the other hand, in the example shown in FIG. 4B, data including the 45th bit and 46th bit (00) forms the data pattern (0001) together with data including the first bit and the second bit (01) of the next unit. Therefore, the data pattern (0001) is not the data pattern immediately preceding to the position P. The preceding 4 bits started from the 41th bit to the 44th bit (0011) is the data pattern immediately preceding to the insertion position P. Therefore, the position Q of the last bit of the data pattern immediately preceding to the insertion position P will be the position of the 44th bit which is the last bit of the data pattern (0011).

In the example of FIG. 4B, the position between the 44th bit of the position Q and the 45th bit which is the next bit is determined as the control breakpoint B of data.

The control segment is the above parity calculation segment or the DSV control segment. To which segment of the parity calculation segment and the DSV control segment the control segment belongs is determined by given rules in advance such that the DSV control segment and the parity calculation segment are alternately generated from the start. Therefore, the control segment determination unit 15 can determine to which segment the control segment belongs based on the rules.

Only one bit is included as the DSV bit in the DSV control segment. Accordingly, the DSV control can be performed with good condition.

The DSV control segment may be a fixed value. In this case, for example, a position 10 data preceding to the position of the information bit is designated as the control breakpoint B of each segment. That is, the control breakpoint B is set at a position immediately subsequent to the bit which is preceding to the information bit by a fixed number of bits on the basis of the information bit inserted in the data. As the conversion is variable-length conversion, misalignment after conversion is generated, however, the DSV control can be performed so that information based on the channel bits after the fixed breakpoint is allowed to be included in the next segment.

Additionally, it is also preferable that one information bit may be inserted in, for example, every 91 pieces of data. The interval of insertion is optional.

SECOND EMBODIMENT

Configuration of the Data Demodulator

FIG. 5 is a block diagram showing a configuration the data demodulator 1 according to a second embodiment of the invention. In the embodiment, the specific bit is the parity bit.

In the data demodulator of FIG. 5, the specific information processing unit 16 of the data demodulator 1 of FIG. 1 is replaced with a parity information processing unit 41. The correction output unit 17 includes a correction unit 51, a synchronization signal detection unit 52, a channel bit demodulation unit 53, and a selection unit 54. Other components are the same as the embodiment of FIG. 1.

The parity information processing unit 41 performs parity calculation based on the level code row (namely, the channel bit row) from the level code generation unit 12. The parity calculation segment at this time is supplied from the control segment determination unit 15. That parity calculation is calculation in which, for example, the number of "1"s is counted from the level code in the parity calculation segment as a calculation target and whether the result is an even number or an odd number is calculated. The parity information processing unit 41 compares the calculation result with the parity bit embedded in the demodulated data row obtained from the channel bit demodulation unit 14 as the information bit. The parity information processing unit 41 constitutes a calculation means for executing calculation intended by the specific bit inserted in a control segment different from the calculation target with respect to the data in the control segment of calculation target. The calculation intended by the parity bit as the information bit is parity calculation.

When an output from the parity information processing unit 41 is a result requiring correction processing, the correction unit 51 performs correction processing such as equalization processing to the signal from the signal shaping unit 11, then, outputs the signal in the form of the level code or channel bits in the same manner as the level code generation unit 12. The correction unit 51 constitutes a correction means for correcting the input signal based on the calculation result by the calculation means.

The synchronization detection unit 52 detects the synchronization signal from the signal to which the correction processing has been performed by the correction unit 51 and outputs information necessary for demodulation such as position of the synchronization signal to the channel bit demodulation unit 53. The channel bit demodulation unit 53 demodulates the level code or the channel bits to which the correction processing has been performed by the correction unit 51 in accordance with the demodulation table of Table 2 and outputs the data row. At this time, inverse NRZI modulation is performed to the level code according to need to generate an edge code. The channel bit demodulating unit 53 constitutes another conversion means for converting the corrected RLL code of the input signal into second data in accordance with the demodulation table.

Information concerning identification information detected by the synchronization signal detection unit 13 is supplied to the selection unit 54. The selection unit 54 selects one of the data bit row outputted from the channel bit demodulation unit 14 and the data bit row outputted from the channel bit demodulation unit 53 based on the information concerning the identification information and the calculation result outputted by the parity information processing unit 41, outputting the result to the removal unit 18.

That is, in the case that the identification information indicates that the parity bits are inserted, when there is no error as a result of comparison of the parity bit, the data bit row outputted from the channel it demodulation unit 14 is selected. On the other hand, when there is not an error, the data bit row outputted by the channel bit demodulation unit is selected. In the case that the identification information indicates that the parity bits are not inserted, the selection unit 54 selects the data bit row outputted from the channel bit demodulation unit 14. The selection unit 54 constitutes a selection means for selecting one of first data converted by the conversion means and second data converted by another conversion means.

Other components are the same as the embodiment of FIG. 1.

[Input Signal]

Figure 6:
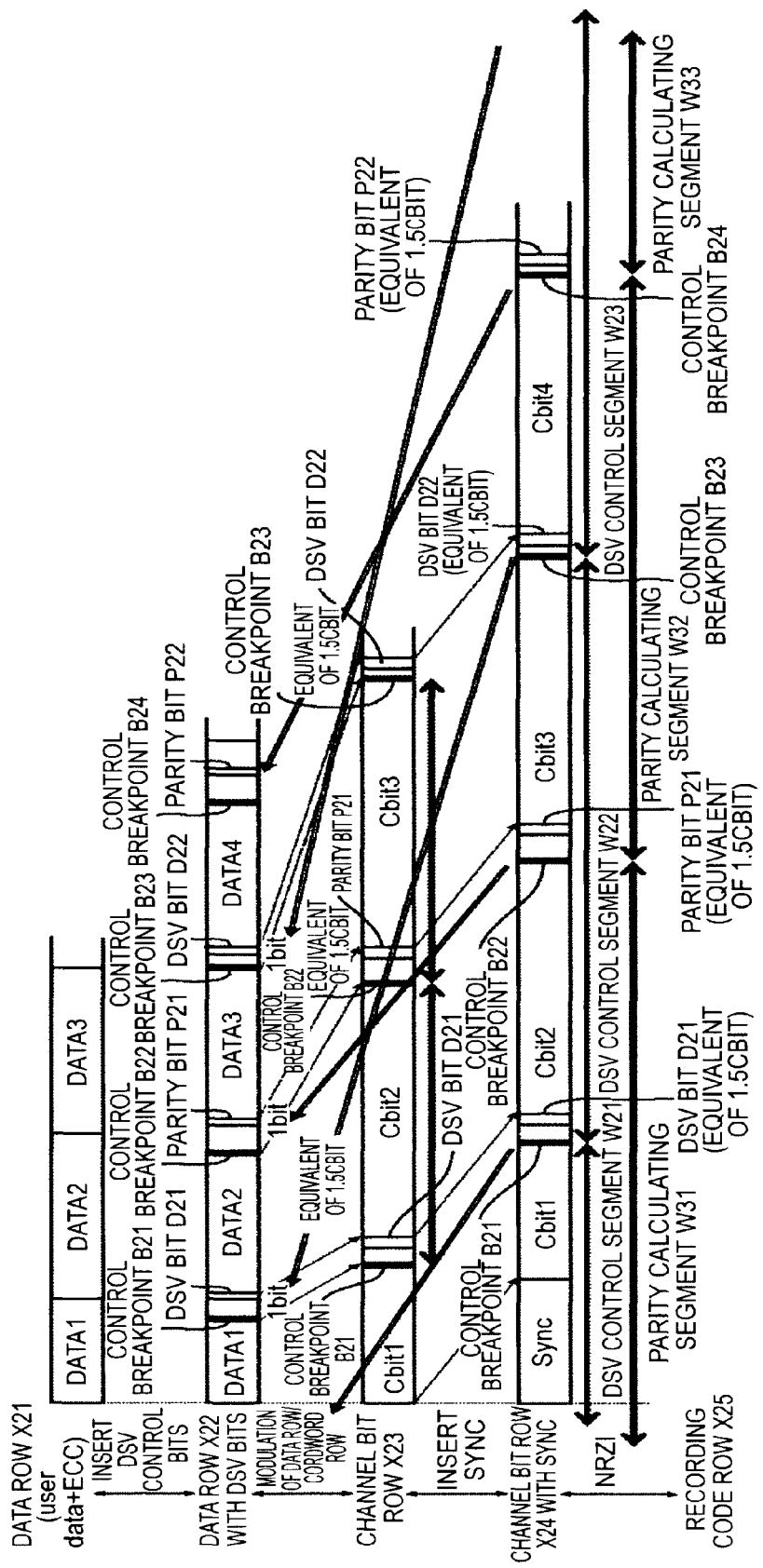
FIG. 6 is a chart for explaining control segments of an input signal.

FIG. 6 is a chart for explaining control segments of the input signal. FIG. 6 shows variation of the signal obtained when the input signal supplied to the data demodulator 1 is generated by a not-shown data modulator.

In FIG. 6, information bits are inserted in the data row to be transmitted at fixed intervals. The information bits are fundamentally DSV bits, however, part of them is replaced with parity bits and the rest remains as the DSV bits.

A data row X21 represents a data row before modulation. The data row X21 includes information data of not only user data but also ECC (Error-Correction Code) and so on. Information bits are inserted in the data row X21 at fixed intervals (specifically, in every 45 bits) and a data row X22 with DSV bits is generated. The information bits are fundamentally the DSV bits, however, part of them is replaced with the parity bits P and the rest remains as the DSV bits D. In the case of the example, the first information bit is the DSV bit D and after that, the parity bit P and the DSV bit D are alternately arranged.

The head segment of the data row X21 is previously allowed to be shorter than other segments on the assumption that the synchronization signal (SYNC) is inserted. Assume that lengths of the DSV control segments in the data row X22 (DATA1, DATA2 and DATA 3) are a-data, b-data and b-data respectively. Lengths (cbit) of respective DSV control segments of a channel bit row X23 (DATA1, DAT2 and DATA3) generated by modulation using a modulation table with a conversion rate m:n=2:3 will be (a×3/2)=(1.5a) or (b×3/2)=(1.5b).

A channel bit row X24 with Sync is generated by inserting a synchronization signal into the channel bit row X23. In a given position of the channel bit row X24 with Sync (the head position preceding to DATA1 in the example of FIG. 6), a synchronization signal block (SYNC) is inserted in the channel bit form. When the number of channel bits of the synchronization signal is c(cbit), the relation represented by the following equation is held between "a", "b" and "c".

$$1.5a+c=1.5b \quad (1)$$

Accordingly, the DSV control is performed at equal intervals even in the format including the synchronization signal.

The DSV bit which is 1-bit data is equivalent to 1.5-channel bit in the channel bit row. That is, the DSV bit of 1-bit inserted in the data row is increased in the channel bit row by the conversion rate as follows.

$$1\text{-bit} \times n/m = 1 \times 3/2 = 1.5\text{-channel bit} \quad (2)$$

The control breakpoint B is set at a position close to the unit boundary T as the boundary of units in which information bit (the DSV bit D or the parity bit P in the case of FIG. 6) is inserted, but different from the unit boundary T.

In the case of the example of FIG. 6, successive control breakpoints B are alternately selected, and the segment between the selected breakpoints is regarded as the DSV control segment. Similarly, another sets of control breakpoints B are alternately selected and the segment between the selected breakpoints is regarded as the parity calculation segment.

That is, in the case of the example of FIG. 6, a segment between a control breakpoint B21 and a control segment B23 coming after a next breakpoint including the next control breakpoint B22 is regarded as a DSV control segment W22, and a segment between the control breakpoint B23 and a control break point B25 (not shown) coming after a next breakpoint including the next control breakpoint B24 is regarded as a next DSV control segment W23. The DSV control segments W are supplied from the control segment determination unit 15 to the parity information processing unit 41.

Similarly, a segment between a control segment B20 (not shown) and the control breakpoint B22 coming after the next breakpoint including the next control breakpoint B21 is regarded as a parity calculation segment W31, and a segment between the control breakpoint B22 and the control breakpoint B24 coming after the next breakpoint including the next control segment B23 is regarded as a parity calculation segment W32. The parity calculation segments W are supplied from the control segment determination unit 15 to the parity information processing unit 41.

The DSV bit is arranged within the DSV control segment as a calculation target. For example, a DSV obtained as a result of DSV calculation regarding the DSV control segment W22 as a target is arranged within the DSV control segment W22 as a DSV bit D21, and a DSV obtained as a result of DSV calculation regarding the DSV control segment W23 as a target is arranged within the DSV control segment W23 as a DSV bit D22.

On the other hand, the parity bit is arranged outside the parity calculation segment as a calculation target. For example, a parity bit obtained as a result of parity calculation regarding the parity calculation segment W31 as a target is arranged outside the parity calculation segment W31 and inside the subsequent parity calculation segment W32 as a parity bit P21, and a parity bit obtained as a result of parity calculation regarding the parity calculation segment W32 as a target is arranged outside the parity calculation segment W32 and inside the subsequent parity calculation segment W33 as a parity bit P22.

In the example of FIG. 6, the DSV control segments and the parity calculation segments are arranged so as not to overlap each other.

The channel bit row X24 with Sync is further NRZI-modulated according to need to thereby generate a recording code row X25 to be recorded in a recording medium. When the NRZI is not performed, the recording code row X25 is generated from the channel bit row X24 with Sync. A signal reproduced from the recording medium will be the input signal of the data demodulator 1. Alternatively, a signal transmitted through the transmission line will be the input signal of the data demodulator 1.

The channel bit row X24 with Sync is generated from the recording code row X25 as the input signal by the level code generation unit 12 of the data demodulator 1 of FIG. 5. A synchronization signal is detected from the channel bit row X24 with Sync by the synchronization signal detection unit 13 and the synchronization signal detection unit 52. The data row X22 with DSV bits is generated from the channel bit row X24 with Sync by the channel bit demodulation unit 14 and the channel bit demodulation unit 53 in accordance with the demodulation table of Table 2. Note that the synchronization signal is still inserted in the data row X22 with DSV bits. Then, redundant bits such as the synchronization signal, the DSV bits "D"s and the parity bits "P"s are removed from the data row X22 with DSV bits by the removal unit 18, and the data row X21 is generated. This will be the reproduction data row.

[Reproducing Processing]

Next, reproducing processing of the data demodulator 1 of FIG. 5 will be explained with reference to FIG. 7 and FIG. 8.

Figure 7:
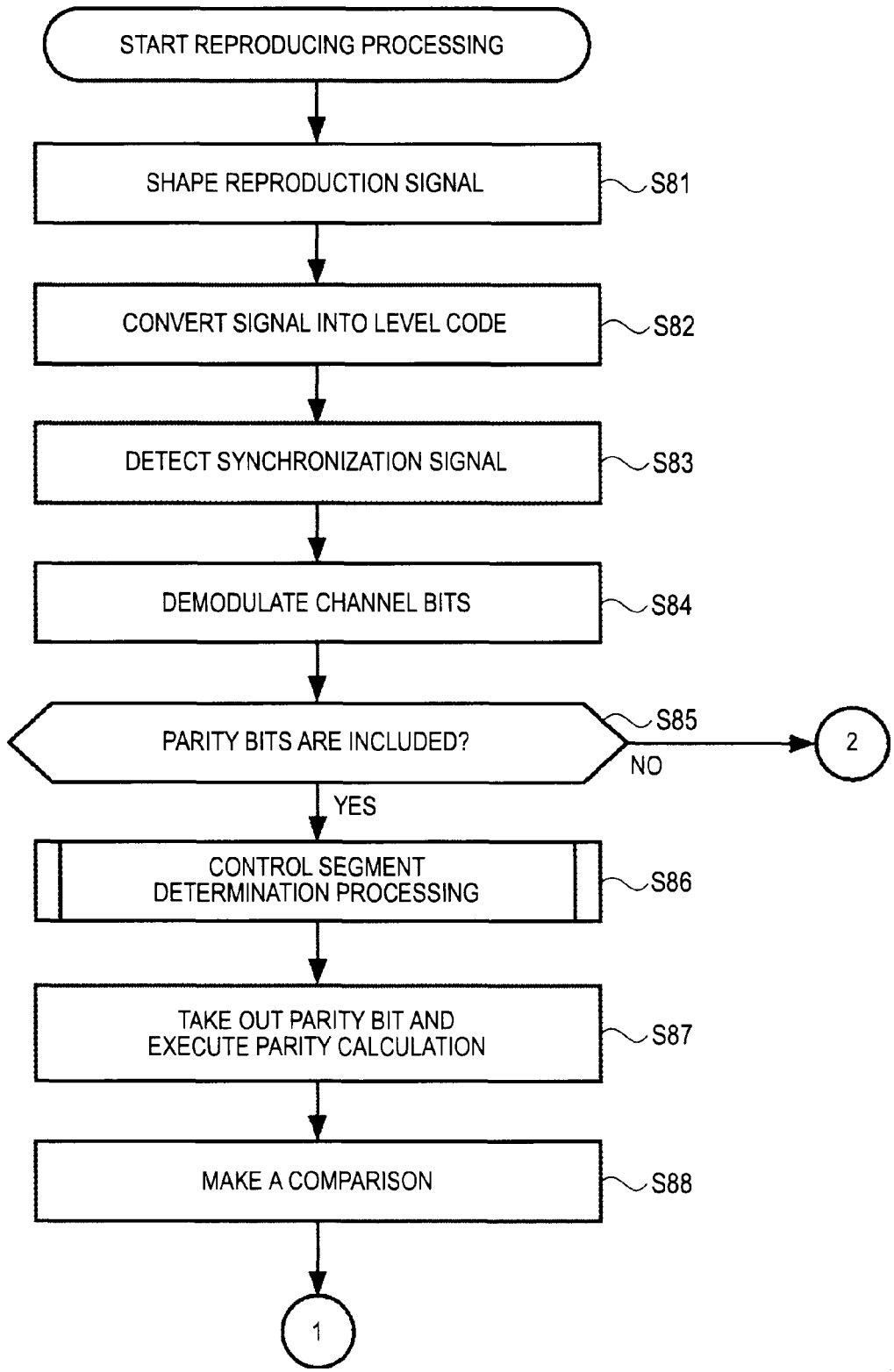
FIG. 7 is a flowchart for explaining reproducing processing.
Figure 8:
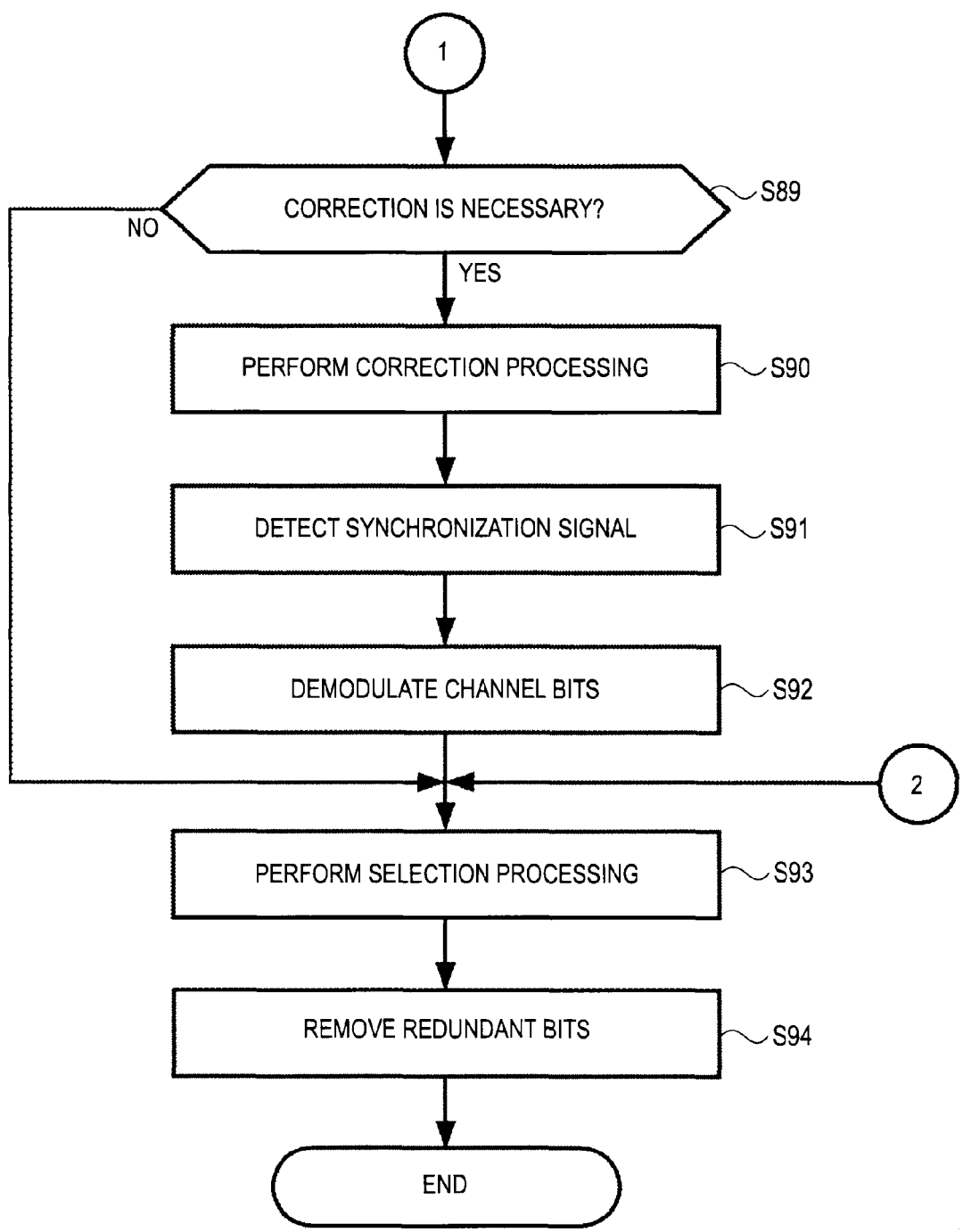
FIG. 8 is a flowchart for explaining reproducing processing.

FIG. 7 and FIG. 8 are flowcharts for explaining reproducing processing.

In Step S81, the signal shaping unit 11 shapes an inputted signal. The following digitalizing processing by the level code generation unit 12 and the correction unit 51 can be positively performed by the processing.

In Step S82, the level code generation unit 12 converts the shaped signal to a level code. The signal is digitalized by the processing.

In Step S83, the synchronization signal detection unit 13 detects a synchronization signal from the level code, namely, the channel bit row. Specifically, the 24-bit synchronization pattern (#01 001 000 000 001 000 000 001) of Table 2 is detected. The synchronization pattern is inserted in a fixed cycle. Accordingly, the channel bit demodulation unit 14, the control segment determination unit 15 and the selection unit 54 execute respective processing on the basis of the position of the synchronization pattern. The synchronization signal detection unit 13 also detects identification information included in additional bits in the synchronous signal block. It is possible to determine whether the data row includes parity bits as the specific bits or not from the identification information.

In Step S84, the channel bit demodulation unit 14 demodulates the channel bits generated by the level code generation unit 12 in Step S82. Specifically, the channel bits are converted into data in accordance with Table 2. For example, the channel bit row X24 with Sync in FIG. 6 is converted into the data row X22 with DVS bits.

In Step S85, the synchronization signal detection unit 13 determines whether the parity bits as specific bits are included or not based on the detected identification information. When the identification information indicates that the parity bits as specific bits are included in the data row, the control segment determination unit 15 executes control segment determination processing in Step S86. According to the processing, the parity calculation segments are determined as explained with reference to FIG. 3 and FIGS. 4A, 4B.

In Step S87, the parity information processing unit 41 takes out the parity bit and executes the parity calculation. In this embodiment, the parity bits are inserted in the data row as the specific bits. Therefore, the parity bit is taken out. The parity calculation as the calculation corresponding to the parity bit is executed with respect to the parity calculation segment as calculation target which has been determined by the control segment determination processing in Step S86.

In Step S88, the parity information processing unit 41 makes a comparison. Specifically, the parity bit taken out in Step S87 is compared with the result of parity calculation performed in Step S87. As described above, the parity bit compared with the result of parity calculation is arranged in the parity calculation segment subsequent to the parity calculation segment as the calculation target. When there is no error in the demodulation data, the parity bit corresponds to the result of parity calculation, and when there is an error in the demodulation data, the parity bit does not correspond to the result of parity calculation.

In Step S89, the correction unit 51 determines whether correction is necessary or not based on the comparison result of the parity information processing unit 41. When the parity bit does not correspond to the result of parity calculation, there is an error in data, it is determined that correction is necessary. In this case, the correction unit 51 performs correction processing in Step S90. That is, the correction processing such as equalization processing is performed with respect to the signal shaped by the signal shaping unit 11. Then, the same processing as the level code generation unit 12 is performed from the signal to generate the channel bit row.

In Step S91, the synchronization signal detection unit detects a synchronization signal. That is, the synchronization signal is detected from the signal corrected by the correction unit 51.

In Step S92, the channel bit demodulation unit 53 demodulates the channel bits corrected by the correction unit in Step S90 on the basis of the position of the synchronization signal detected by the synchronization signal detection unit 52. Specifically, the channel bits are converted to data in accordance with Table 2.

In Step S93, the selection unit 54 performs selection processing. That is, the selection unit 54 selects one of the data row demodulated by the channel bit unit 53 and the data row demodulated by the channel bit demodulation unit 14. In this case, as the comparison result in Step S88 does not correspond to the parity bit and it has been determined that correction is necessary, the data demodulated by the channel bit demodulation unit 53 is selected. Accordingly, the data row demodulated from the correction signal is selected when there is an error, therefore, data with lesser error is outputted.

The removal unit 18 removes redundant bits in Step S94. In the case of the embodiment, the DSV bits, the parity bits and the synchronization pattern block as redundant bits are removed from the data row, and the data row is outputted as a reproduction data row.

In the case the parity bit corresponds to the parity calculation result as a result of comparison, it is determined that correction is not necessary in Step S89. In this case, the correction processing is not necessary as there is no error in data. Accordingly, the processing from Step S90 to Step S92 is skipped and the selection unit 54 executes selection processing in Step S93. At this time, the data row outputted by the channel bit demodulation unit 14 is selected. The processing of removing redundant bits is further executed in Step S94. That is, the DSV bits, the parity bits and the synchronization pattern block as redundant bits are removed from the data row, and the data row is outputted as a reproduction data row.

When it is determined that the parity bits as the specific bits are not included in Step S85, the comparison processing and the correction processing is not necessary, therefore, the processing from Step S86 to Step S92 is skipped. That is, in this case, the selection unit 54 executes the selection processing in Step S93. At this time, the data row outputted from the channel bit demodulation unit 14 is selected. The processing of removing redundant bits is further executed in Step S94. That is, the DSV bits, the parity bits and the synchronization pattern block as redundant bits are removed from the data row, and the data row is outputted as a reproduction data row.

As described above, in the system reproducing a recording medium so that part of the DSV bits inserted at given intervals is replaced with the parity bits, it is possible to recognize that the parity bits are embedded instead of the DSV bits by reading identification information. Accordingly, the recording/reproducing characteristics can be further stabilized. Particularly, reproduction having better quality with lesser error is realized by using the parity bits.

THIRD EMBODIMENT

Configuration of the Data Demodulator

Figure 9:
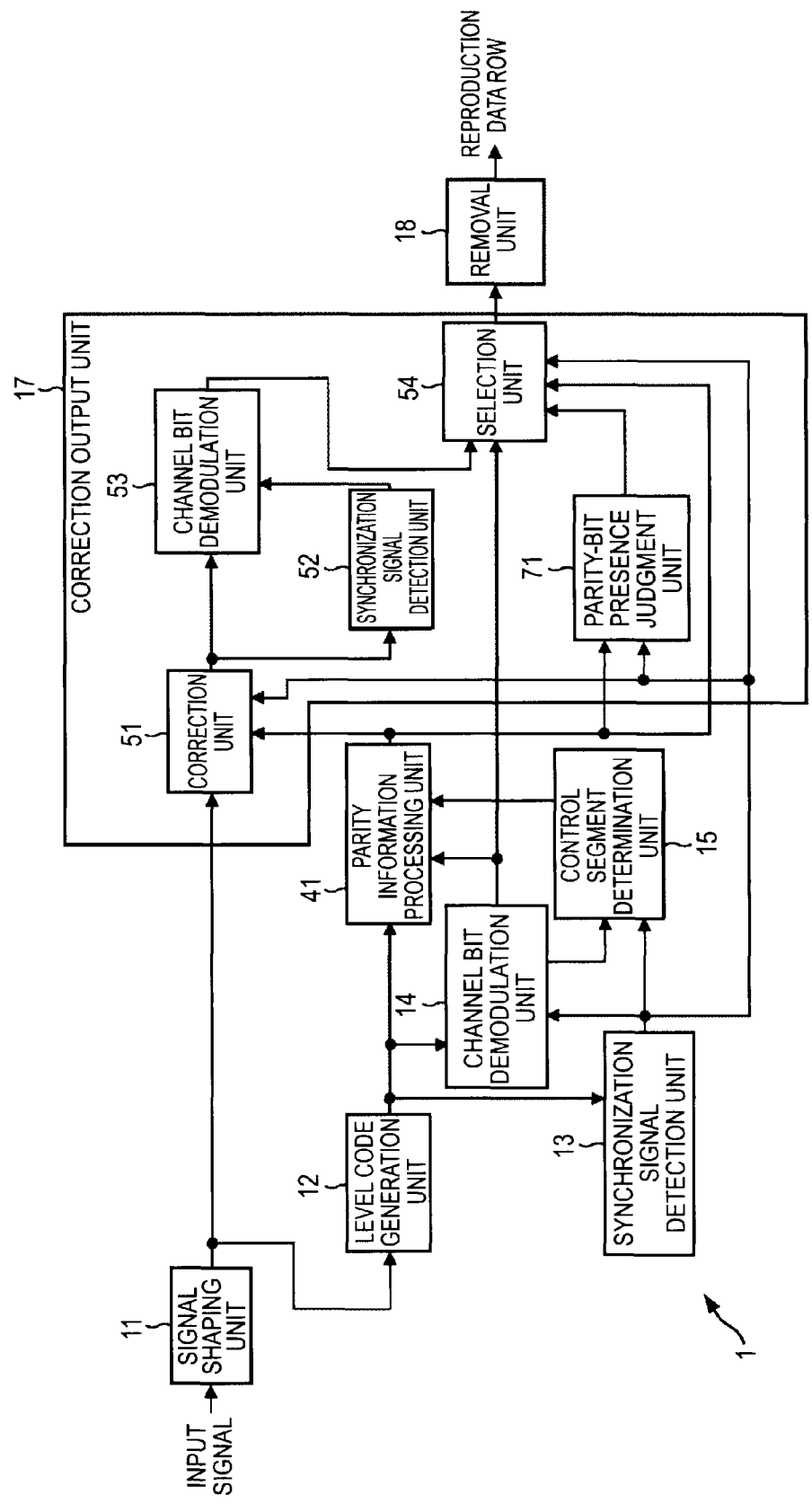
FIG. 9 is a block diagram showing a configuration of a data demodulator according to an embodiment of the invention.

FIG. 9 is a block diagram showing a configuration of the data demodulator 1 according to a third embodiment of the invention. In the embodiment, the specific bit is the parity bit.

In the data demodulator 1 in FIG. 9, the correction output unit 17 of the data demodulator 1 of FIG. 5 includes a parity-bit presence judgment unit 71 in addition to the correction unit 51, the synchronization detection unit 52, the channel bit demodulation unit 53 and the selection unit 54. Other components are the same as the embodiment of FIG. 5.

The parity-bit presence judgment unit 71 judges presence of parity bits by accumulating information from the parity information processing unit 41 at the previous stage. Accordingly, in the embodiment, the parity bit can be used not only in the case in which identification information is recorded in additional bits but also in the case in which the information is not recorded therein.

The parity-bit presence judgment unit 71 judges the presence of parity bits, for example, in the following manner. That is, the parity-bit presence judgment unit 71 stores more than given number of results of comparison of parity calculation and refers to probability that correction is necessary. For example, in the case that part of the DSV bits is replaced with the parity bits alternately, when the length of the DSV control segment is 46 data (45+1 control bits) which will be described later, the length obtained by being converted into channel bits will be as follows.

46*conversion rate ($n/m$, $m=2$, $n=3$)*segment (2 because of alternate arrangement)

46*(3/2)*2=138

When a bit error rate is approximately $1.0 \times 10^{\wedge}$ (−4), the parity control segment at which the error occurs is once in approximately 70 sections based on 10000/138.

On the other hand, in the case that only the DSV bits are included, namely, in the case that part of the DSV bits is not replaced with the parity bits, when probabilities that "1" and "0" of the DSV bits occur are the same, it is considered that the error occurring when the bits are regarded as parity bits will be generated once in two control segments. Accordingly, the presence of parity bits can be determined by using the difference. That is, when the signal which should be corrected is higher than a given reference value which is previously set, it can be determined that the parity bits are not inserted. Conversely, when the signal which should be corrected is lower than the given reference value which is previously set, it can be determined that the parity bits are inserted. The parity-bit presence judgment unit 71 constitutes a judgment means for judging that the parity bits are inserted instead of part of the DSV bits from the probability that the comparison result occurs.

The selection unit 54 performs selection processing in a comprehensive manner based on identification information detected by the synchronization signal detection unit 13, the comparison result by the parity information processing unit 41 and the judgment result by the parity-bit judgment unit 71.

[Reproducing Processing]

Next, reproducing processing by the data demodulator 1 of FIG. 9 will be explained with reference to FIG. 10 and FIG. 11.

Figure 10:
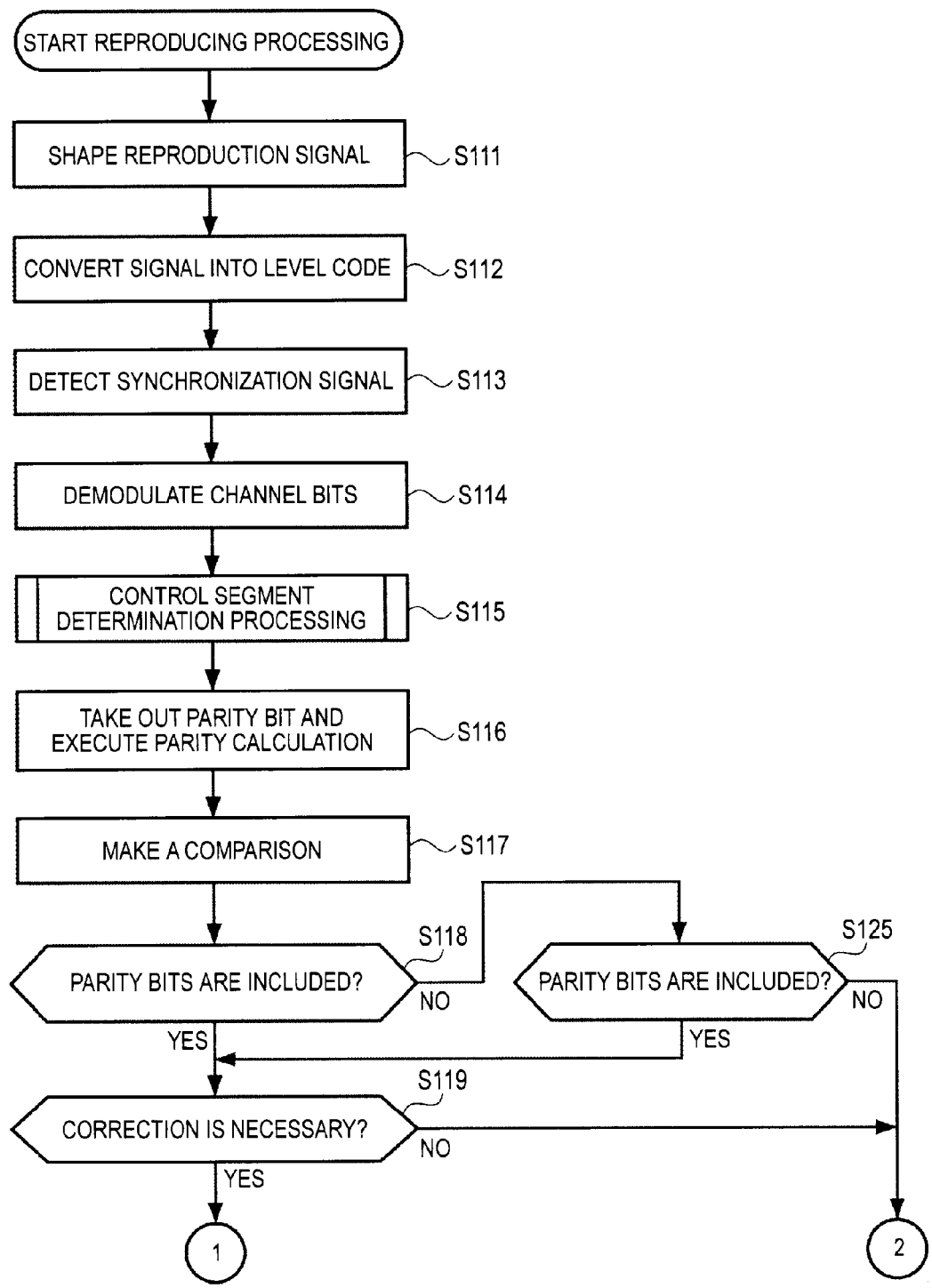
FIG. 10 is a flowchart for explaining reproducing processing.
Figure 11:
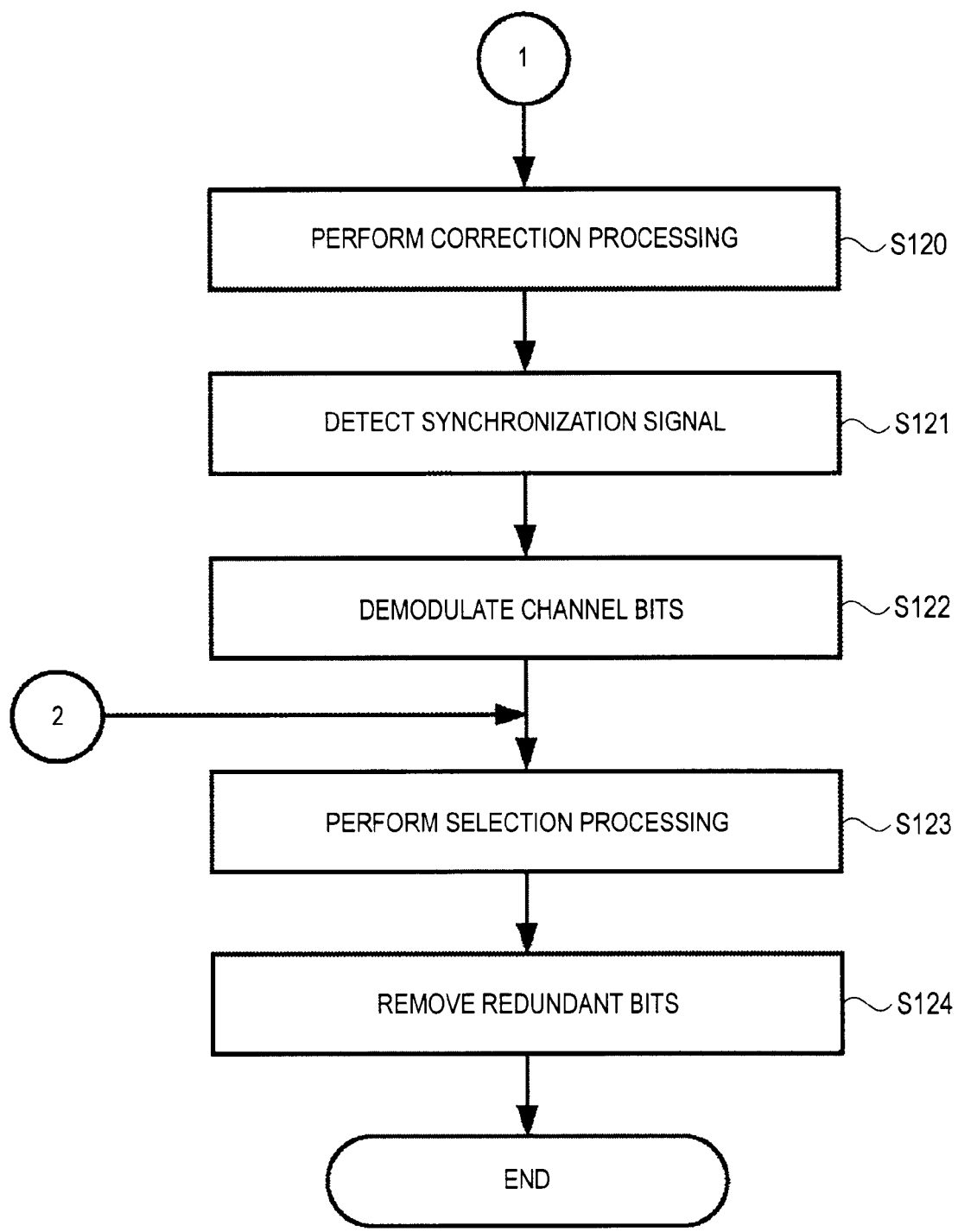
FIG. 11 is a flowchart for explaining reproducing processing.

FIG. 10 and FIG. 11 are flowcharts for explaining reproducing processing.

In Step S111, the signal shaping unit 11 shapes an inputted signal. The following digitalizing processing by the level code generation unit 12 can be positively performed by the processing.

In Step S112, the level code generation unit 12 converts the shaped signal to a level code. The signal is digitalized by the processing.

In Step S113, the synchronization signal detection unit 13 detects a synchronization signal from the level code, namely, the channel bit row. The synchronization signal detection unit 13 also detects identification information included in additional bits in the synchronous signal block. Accordingly, it is possible to determine whether the data row includes the parity bits as the specific bits or not from the identification information.

In Step S114, the channel bit demodulation unit 14 demodulates the channel bits generated by the level code generation unit 12 in Step S112. Specifically, the channel bits are converted into data in accordance with Table 2. For example, the channel bit row X24 with Sync in FIG. 6 is converted into the data row X22 with DVS bits.

In Step S115, the control segment determination unit 15 executes control segment determination processing. According to the processing, the control segments to be calculation targets are determined as explained with reference to FIG. 3 and FIGS. 4A, 4B.

In Step S116, the parity information processing unit 41 takes out the parity bit and executes the parity calculation. In this embodiment, the parity bits are inserted in the data row as the specific bits. Therefore, the parity bit is taken out. The parity calculation as the calculation corresponding to the parity bit is executed with respect to the parity calculation segment which has been determined by the control segment determination processing in Step S115.

In Step S117, the parity information processing unit 41 makes a comparison. Specifically, the parity bit taken out in Step S116 is compared with the result of parity calculation performed in Step S116. When there is no error in the demodulation data, the parity bit corresponds to the result of parity calculation, and when there is an error in the demodulation data, the parity bit does not correspond to the result of parity calculation.

In Step S118, the synchronization signal detection unit 13 determines whether the parity bits as specific bits are included or not based on the detected identification information. When the identification information indicates that the parity bits as specific bits are included in the data row, the correction unit 51 determines whether correction is necessary or not based on the comparison result of the parity information processing unit 41 in Step S119. When the parity bit does not correspond to the result of parity calculation, there is an error in data, therefore, the correction unit 51 performs correction processing in Step S120. That is, the correction processing such as equalization processing is performed with respect to the signal shaped by the signal shaping unit 11. Then, the same processing as the level code generation unit 12 is performed from the signal to generate the channel bit row.

In Step S121, the synchronization signal detection unit 13 detects a synchronization signal. That is, the synchronization signal is detected from the signal corrected by the correction unit 51.

In Step S122, the channel bit demodulation unit 53 demodulates the channel bits corrected by the correction unit in Step S120 on the basis of the position of the synchronization signal detected by the synchronization signal detection unit 52. Specifically, the channel bits are converted to data in accordance with Table 2.

In Step S123, the selection unit 54 performs selection processing in Step S123. In this case, it has been determined that correction is necessary in Step S119, therefore, the selection unit 54 selects the data row demodulated by the channel bit demodulation unit 53 instead of selecting the data row demodulated by the channel bit demodulation unit 14. Accordingly, as the data row demodulated from the correction signal is selected when there is an error, data with lesser error is selected and outputted.

The removal unit 18 removes redundant bits in Step S124. In this case, the DSV bits, the parity bits and the synchronization pattern block as redundant bits are removed from the data row, and the data row is outputted as a reproduction data row.

When the parity bit corresponds to the parity calculation result, it is determined that the correction is not necessary in Step S119. As there is no error in this case, the correction processing is not necessary. Therefore, the processing from Step S120 to Step S122 is skipped, and the selection unit 54 executes selection processing in Step S123. At this time, the data row outputted by the channel bit demodulation unit 14 is selected. Furthermore, processing of removing redundant bits is executed in Step S124. That is, the DSV bits, the parity bits and the synchronization pattern block as redundant bits are removed from the data row, and the data row is outputted as a reproduction data row.

In Step S118, when it is determined that the parity bits as the specific bits are not included based on the detected identification information by the synchronization signal detection unit 13, processing of Step S125 is performed. The case includes not only the case in which identification information indicates that the parity bits as the specific bits are not included but also there is no identification information.

When it is determined that there is no identification information by the synchronization signal detection unit 13 in Step S118, the parity-bit presence judgment unit 71 judges whether the parity bits are included or not in Step S125. That is, the parity-bit presence judgment unit 71 stores more than given number of comparison results of parity calculation by the parity information processing unit 41. As described above, part of the DSV bits is replaced with the parity bits, and for example, when the replacement is performed alternately, it is considered that an error occurs once in approximately 70 control segments as probability when the channel bit error rate is $1.0 \times 10^{\wedge}(-4)$.

On the other hand, in the case that only the DSV bits are included, that is, in the case that part of the DSV bits is not replaced with the parity bits, when probabilities that "1" and "0" of the DSV bits occur are the same, it is considered that the error occurring when the bits are regarded as parity bits will be generated once in two control segments. Accordingly, when the result that the parity bit does not correspond to the calculation result is generated in a range larger than 2 as well as smaller than 70, for example, in frequency of more than once in 30 control segments, the parity-bit presence judgment unit 71 judges that the parity bits are not included. Whereas, when the occurrence frequency is less than once in 30 control segments, the parity-bit presence judgment unit 71 judges that the parity bits are included.

The determination standard can be determined with reference to the interval between which the parity bit is inserted. The determination standard varies in the case that all DSV bits are parity bits and in the case that, for example, one parity bit is inserted in every 10 DSV bits, because the standard determination segment differs by 10 times.

When it is determined that the parity bits are not included in Step S125, the selection unit 54 performs selection processing in Step S123. At this time, it is difficult that the selection unit 54 performs correction processing, therefore, the data row outputted by the channel bit demodulation unit 14 is selected.

Next, the processing of removing redundant bits is executed in step S124. That is, the removal unit 18 removes the DSV bits, the parity bits and the synchronization pattern block as redundant bits from the data row, and outputs the data row as a reproduction data row.

When it is determined that the parity bits are included in Step S125, the processing proceeds to Step S119. After that, the same processing performed when determined that the parity bits are included in Step S118 is executed.

According to the above processing, it is possible to stabilize recording/reproducing characteristics not only in the case that identification information is recorded in the additional bits of the synchronization signal block in the recording medium but also in the case that the information is not recorded therein. Particularly, the processing is performed by taking out the parity bit, therefore, reproduction with good quality and lesser error can be executed.

FOURTH EMBODIMENT

Configuration of the Data Demodulator

Figure 12:
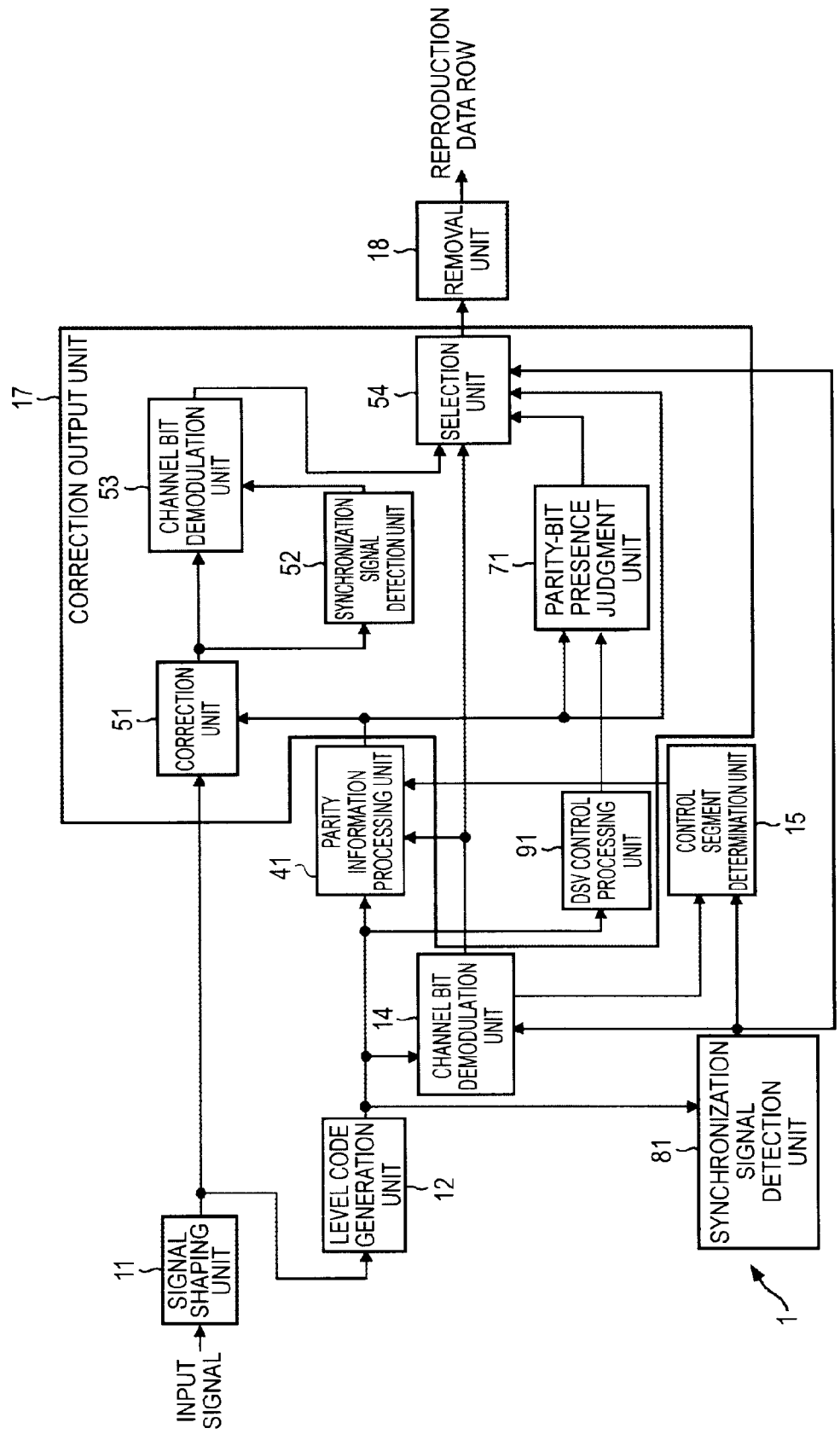
FIG. 12 is a block diagram showing a configuration of a data demodulator according to an embodiment of the invention.

FIG. 12 is a block diagram showing a configuration of the data demodulator 1 according to a fourth embodiment of the invention. In the embodiment, the specific bit is the parity bit.

In the data demodulator 1 of FIG. 12, the synchronization detection unit 13 of FIG. 9 is replaced with a synchronization signal detection unit 81. Additionally, a DSV control processing unit 91 is provided. Other components are the same as the embodiment of FIG. 9.

The synchronization signal detection unit 81 detects a synchronization signal and outputs a position signal thereof to respective units, however, the unit does not have a function of detecting identification information in the synchronization signal block. The DSV control processing unit 91 calculates a segment DSV in a unit of the DSV control segment based on the level code outputted by the level code generation unit 12. Specifically, for example, the level code has two values of "1" and "0", the integration is performed by regarding "1" as "+1" and by regarding "0" as "−1". The DSV control processing unit 91 constituting a DSV calculation means performs calculation of the segment DSV, and performs the DSV calculation of adding the accumulated DSV.

The parity-bit presence judgment unit 71 accumulates the DSV control information from the DSV control processing unit 91 and information from the parity information processing unit 41 to determine the presence of parity bits in a comprehensive manner. That is, when all information bits are the DSV bits and there does not exist a parity bit, the absolute value of the DSV from the DSV control processing unit 91 is close to "0". As the replacement rate of the DSV bits is increased with respect to the parity bits, the number of DSV bits is reduced, therefore, the absolute value of the DSV is increased. Accordingly, when the absolute value of the DSV is smaller than a first reference value, it is possible to determine that there does not exist a parity bit. Conversely, when the absolute value of the DSV is larger than a second reference value, it is possible to determine that there exist parity bits. In the case that there are the format in which one bit is inserted in every 45 bits as well as a format in which one information bit is inserted in every 91 bits, the absolute value of the DSV becomes larger in the former case as long as the replacement rate of the DSV bit to the parity bit is the same.

[Reproducing Processing]

Next, reproducing processing of the data demodulator 1 of FIG. 12 will be explained with reference to FIG. 13 and FIG. 14.

Figure 13:
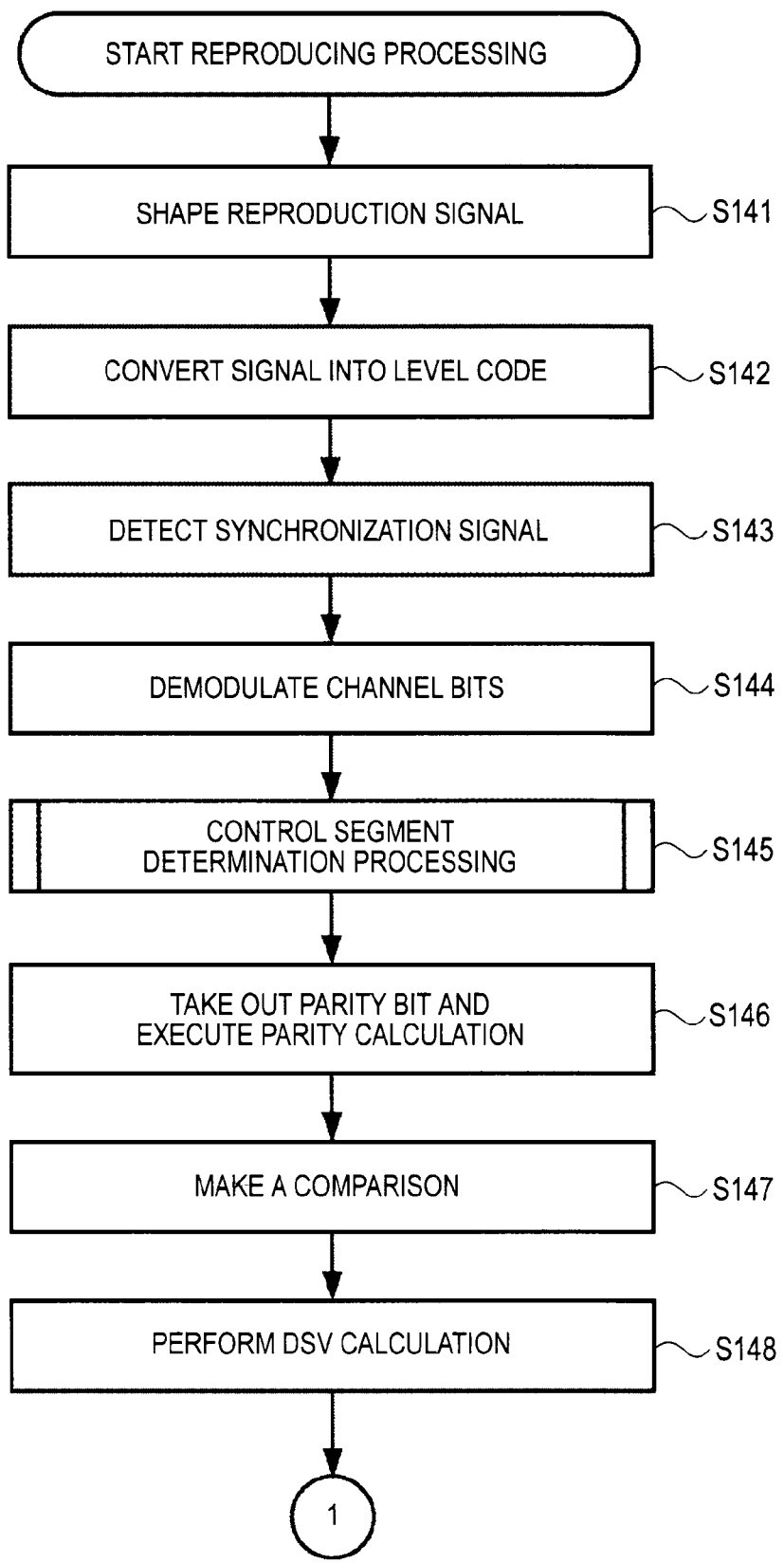
FIG. 13 is a flowchart for explaining reproducing processing.
Figure 14:
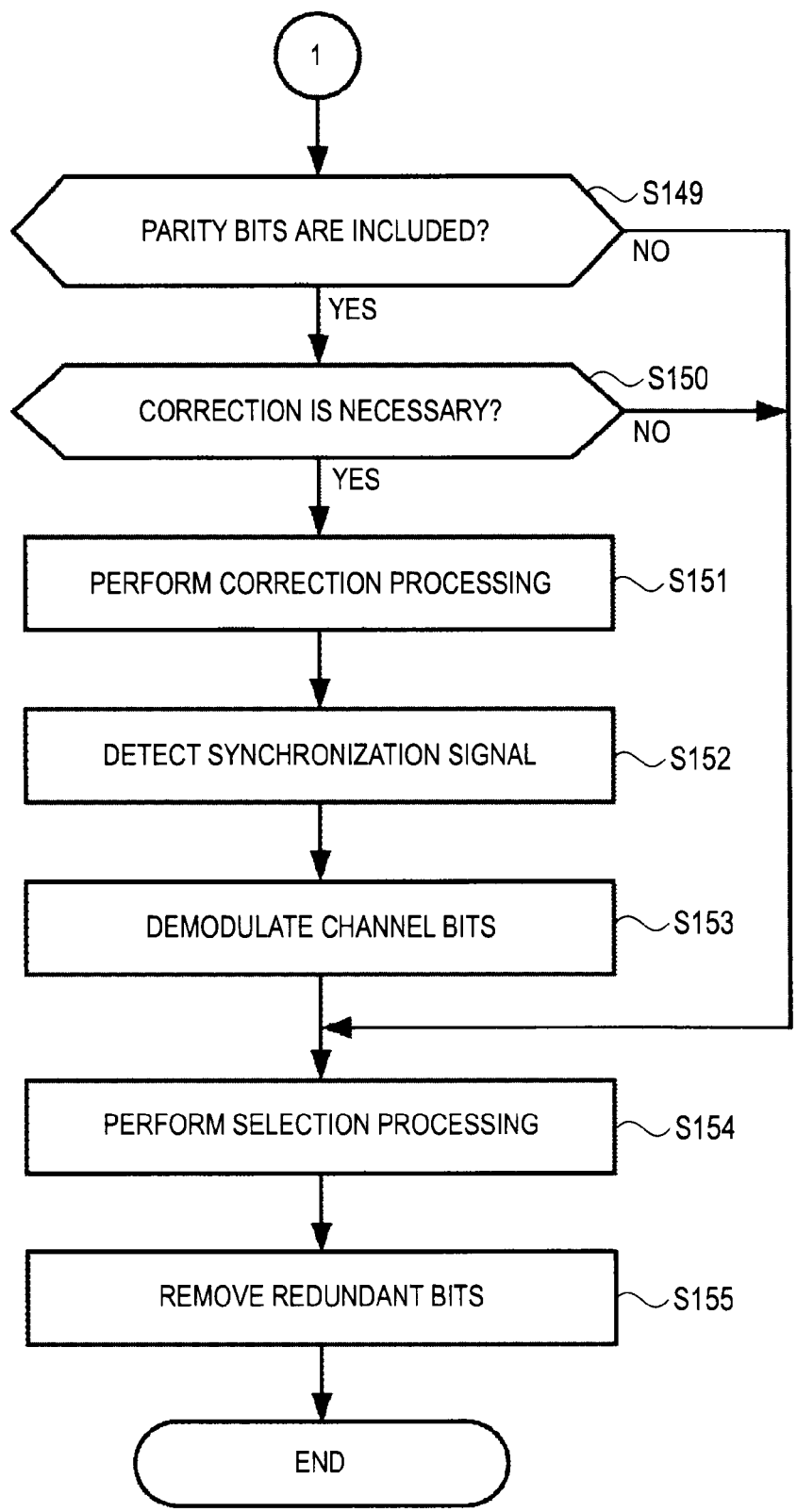
FIG. 14 is a flowchart for explaining reproducing processing.

FIG. 13 and FIG. 14 are flowchart for explaining reproducing processing.

In Step S141, the signal shaping unit 11 shapes an inputted signal. The following digitalizing processing by the level code generation unit 12 can be positively performed by the processing.

In Step S142, the level code generation unit 12 converts the shaped signal to a level code. The signal is digitalized by the processing.

In Step S143, the synchronization signal detection unit 81 detects a synchronization signal from the level code, namely, the channel bit row and outputs the position signal thereof to respective units. The synchronization signal detection unit 81 does not have the function of detecting identification information included in the additional bits.

In Step S144, the channel bit demodulation unit 14 demodulates the channel bits generated by the level code generation unit 12 in Step S142. Specifically, the channel bits are converted into data in accordance with Table 2. For example, the channel bit row X24 with Sync in FIG. 6 is converted into the data row X22 with DVS bits.

In Step S145, the control segment determination unit 15 executes control segment determination processing. According to the processing, the DSV control segment and the parity calculation segment are determined as explained with reference to FIG. 3 and FIGS. 4A, 4B.

In Step S146, the parity information processing unit 41 takes out the parity bit and executes the parity calculation. In this embodiment, the parity bits are inserted in the data row as the specific bits. Therefore, the parity bit is taken out. The parity calculation as the calculation corresponding to the parity bit is executed with respect to the parity calculation segment as the calculation target, which has been determined by the control segment determination processing in Step S145.

In Step S147, the parity information processing unit 41 makes a comparison. Specifically, the parity bit taken out in Step S146 is compared with the result of parity calculation performed in Step S146. When there is no error in the demodulation data, the parity bit corresponds to the result of parity calculation, and when there is an error in the demodulation data, the parity bit does not correspond to the result of parity calculation.

In Step S148, the DSV control processing unit 91 executes DSV calculation. Specifically, the segment DSV of the level code in each DSV control segment generated by the level code generation unit 12 is calculated, and further the accumulated DSV is calculated. The DSV control segments are designated by the control segment determination unit 15.

In Step S149, the parity-bit presence judgment unit 71 judges whether the parity bits are included as the specific bits based on output of the parity information processing unit 41. The processing is not based on identification information of the additional bits.

The result of calculation by the DSV control processing unit 91 is higher than, for example, 108(=(136+80)/2) from "peak DSV" of Table 3 which is later described, the parity-bit presence judgment unit 71 judges that the DSV control is not performed, namely, the parity bits are included.

When it is difficult to determine that the parity bits are included from the DSV, the parity-bit presence judgment unit 71 further judges whether the parity bits are included or not based on output of the parity information processing unit 41. Specifically, when the absolute value of "peak DSV" is lower than 108, the judgment based on output of the parity information processing unit 41 is further made.

That is, the parity-bit presence judgment unit 71 judges that the parity bits are not included when the result indicating that the parity bit does not correspond to the calculation result is generated, for example, in frequency of more than once in 30 control segments as a reference value. Conversely, the parity-bit presence judgment unit 71 judges that the parity bits are included when the result indicating that the parity bit does not correspond to the calculation result is generated, for example, in frequency of less than once in 30 control segments as the reference value.

When it is determined that the parity bits as the specific bits are included in the data row in Step S149, the correction unit 51 determines whether correction is necessary or not based on the comparison result of the parity information processing unit 41 in Step S150. When the parity bit does not corresponding to the parity calculation result, there is an error in data, therefore, correction unit 51 makes a correction in Step S151. That is, correction processing such as equalization processing is performed to the signal shaped by the signal shaping unit 11. Then, the same processing as the level code generation unit 12 is performed from the signal to generate a channel bit row.

The synchronization signal detection unit 52 detects a synchronization signal in Step S152. That is, the synchronization signal is detected from the signal corrected by the correction unit 51.

The channel bit demodulation unit 53 demodulates the channel bits corrected by the correction unit 51 in Step S151 on the basis of the position of the synchronization signal detected by the synchronization signal detection unit 52 in Step S153. Specifically, the channel bits are converted into data in accordance with Table 2.

The selection unit 54 performs selection processing in Step S154. In this case, the correction processing has been made, therefore, data row demodulated by the channel bit demodulation unit 53 is selected. Accordingly, the data row demodulated from the correction signal is selected when there is an error, therefore, data with lesser error is selected and outputted.

In Step S155, the removal unit 18 removes redundant bits. Specifically, the DSV bits, the parity bits and the synchronization pattern block as redundant bits are removed from the data row, and the data row is outputted as a reproduction data row.

There is no error in data when it is determined that correction is not necessary in Step S150, therefore, the correction processing is not necessary. Accordingly, processing from Step S151 to Step S153 is skipped and the selection unit 54 executes the selection processing in Step S154. In this case, the correction processing has not been performed, therefore, the data row outputted by the channel bit demodulation unit 14 is selected. Furthermore, the processing of removing redundant bits are performed in Step S155. That is, the DSV bits, the parity bits and the synchronization pattern block as redundant bits are removed from the data row, and the data row is outputted as a reproduction data row.

When it is determined that the parity bit as the specific bit is not included in Step S149, correction processing is not performed. Accordingly, the same processing as in the case that it has been determined that correction is not necessary in Step S150 is performed also in the case. That is, processing from Step S151 to Step S153 is skipped and processing of Step S154 and Step S155 is performed.

According to the processing, the processing can be performed by taking out the parity bit even in the case that the synchronization signal detection unit 81 does not have the function of detecting identification information, therefore, reproduction with good quality and lesser error can be realized.

The DSV determination may be made with respect to a segment different from the control segment, in addition to the above example. In such case, the determination will be made with respect to a sufficiently long segment.

In the fourth embodiment, the synchronization signal detection unit 81 is used, which detects the synchronization signal and outputs the position signal thereof to respective units but does not have a function of detecting identification information in the synchronization signal block. However, it goes without saying that objectives can be achieved more efficiently by using the synchronization signal detection unit 13 having the function of detecting identification information in the synchronization signal block.

[Verification Results]

Results of verification obtained by using the variable-length table of Table 2 will be shown as follows. In Table 2 in which the continuity of the minimum inversion interval Tmin is limited as well as the data row having information bits inserted in the data row is converted by the variable length table, the number of successive minimum inversion intervals Tmin is limited to 6 times by the plural minimum-run continuity limitation table.

The simulation shows respective results as well as "peak DSV" in the case that information bits to be embedded by using Table 2 are in the following conditions.
(1) only DSV bits are inserted
(2) only parity information bits are inserted
(3) DSV bit and parity information bit are alternately inserted Note that "45+1" indicates that one information bit is inserted in every 45 bits and "91+1" indicates that one information bit is inserted in every 91 bits.

Random data 634,880 data optionally created was converted into code word rows (channel bit rows) by the above method by inserting one bit of the information bit in every 45 data in consideration of the synchronization pattern and performing respective control. Moreover, the synchronization patterns (including 9T-9T) were inserted at intervals of 1240 data so as to correspond to data rows. The number of synchronization signals inserted at this time is 512 (=634,880/1, 240). The synchronization pattern has 30 channel bits and the latter 6 channel bits are assigned as the identification pattern. The identification patterns can be used for identifying respective positions by being arranged at given positions.

Results obtained by converting the data into cord word rows (channel bit rows) are as follows.

Numerals of respective results were calculated in the following manner.

T_size[2 to 10]: The number of occurrence of respective runs from 2T to 10T
Sum: The total number of bits
Total: The total number of occurrence of respective runs (2T, 3T . . . )
Average Run: (Sum/Total)
Numerals of run distribution: (T_size[i]*(i)/(Sum), i=2, 3, 4 . . . 10

Numerals shown in columns of 2T to 10T of Table 3 indicates numerals of the run distribution.

max-RMTR: The maximum number in which the minimum run is repeated peak DSV: peaks on the positive side and peaks of the negative side of the DSV values when calculating the DSV values in the process of performing the DSV control of the cord word row DSV: DSV value at the last end of the cord word row, which corresponds to the difference of "1" and "0" of the cord word row

TABLE 3

|  | (1) DSV | (2) parity | (3) DSV + parity |
|---|---|---|---|
| parity control | No | Yes | Yes |
| Average Run | 3.381 | 3.384 | 3.384 |
| Sum | 989184 | 989184 | 989184 |
| Total | 292565 | 292291 | 292334 |
| 2T | 0.224 | 0.224 | 0.224 |
| 3T | 0.220 | 0.220 | 0.220 |
| 4T | 0.193 | 0.192 | 0.192 |
| 5T | 0.150 | 0.149 | 0.150 |
| 6T | 0.108 | 0.109 | 0.109 |
| 7T | 0.057 | 0.057 | 0.057 |
| 8T | 0.038 | 0.039 | 0.039 |
| 9T | 0.009 (1024) | 0.009 (1024) | 0.009 (1024) |
| 10T | 0.000 | 0.000 | 0.000 |
| max-RMTR | 6 | 6 | 6 |
| peak DSV | −30 to +26 | −1460 to +136 | −66 to +80 |
| DSV | −6 | −990 | 0 |

In the result shown in Table 3, the occurrence of the maximum run 9T corresponds to the fact that 9T-9T is included in the synchronization signals of 512 times, in which the number of occurrence is 1024. It is also confirmed that the minimum run d=1, the maximum run k=7 and continuity of the minimum run is limited to 6 times which are parameters of Table 2 as well as it is shown that the DSV control in the data row is performed concerning the results (1) to (3) according to results of "peak DSV" (values of "peak DSV" fall within a given range).

In the result (2), the last DSV value is −990, which shows that the DSV control has not obviously been performed. In the result (3), the interval of performing the DSV control is doubled. Therefore, "peak DSV" is −30 to +26 in the result (1) and −66 to +80 in the result (3), which shows that performance of the DSV control deteriorates in the result (3). It is possible to determine whether the DSV control information bits are embedded alternately or whether the information bits are embedded at larger intervals by applying "peak DSV" as a determination item.

For example, it is possible to determine that there exist the DSV bits when referring to "peak DSV" as absolute values and the value is smaller than 108 (=(136+80)/2). Furthermore, it is possible to determine that the DSV bit is inserted in a rate of one for every 45 bits when the value is smaller than 48 (=(30+66)/2), and that the DSV bit is inserted in a rate of one for every 91 bits (to insert the parity bit and the DSV bit alternately means two control units=91+1) when the value is larger than 48.

There does not exist a parity bit in the result (1), therefore, the parity control is not performed, however, there exist parity bits in the result (2) and the result (3), therefore, the parity control is performed. As a result, it is possible to reduce the occurrence of an error, therefore, a more stable system can be provided.

According to the above, when the signal recorded in the recording medium does not have a fixed pattern for performing presence determination of parity bits in the synchronization signal block as a format, or when both the DSV bit and the parity bit exist, processing can be performed by taking out the parity bit, therefore, a more stable system can be realized.

According to the information from the DSV control processing unit 91, not only determination whether the DSV bits are included as the information bits as a system but also estimation whether the DSV bits are included at which intervals can be performed, therefore, a more stable system can be realized.

According to the above, when a recording code row is created by using a table such as Table 2, in the case that the suppression of DC components is not necessary with respect to the format previously determined as a system, the following action can be taken. That is, it is possible to perform recording by replacing part of bits for the DSV control inserted at given intervals with the parity bits. In this type of recording media, more efficient data recording is performed, and the parity bit is used by the configuration of the embodiment of the invention, thereby performing more stable data reproduction.

Even when it is necessary to suppress DC components, it is possible to replace bits for the DSV control inserted at given intervals with the parity bits partially in the format previously determined as a system when the suppression of DC components is more than necessary. In the recording media recorded in this manner, more efficient data recording is performed, and the parity bit is used by the configuration of the embodiment of the invention, thereby performing more stable data reproduction.

As described above, according to the embodiments of the invention, the system having further stable recording/reproducing characteristics can be realized while using the previously determined format.

In the embodiment of the invention, bits for the DSV control are used, and even when the system side performing recording is not compatible to the processing in which parity information is embedded, correction processing can be controlled by determining that the specific processing (for example, parity processing) is not performed. Therefore, the embodiments have compatibility that stable reproducing processing can be performed.

[Configuration of a Computer]

Figure 15:
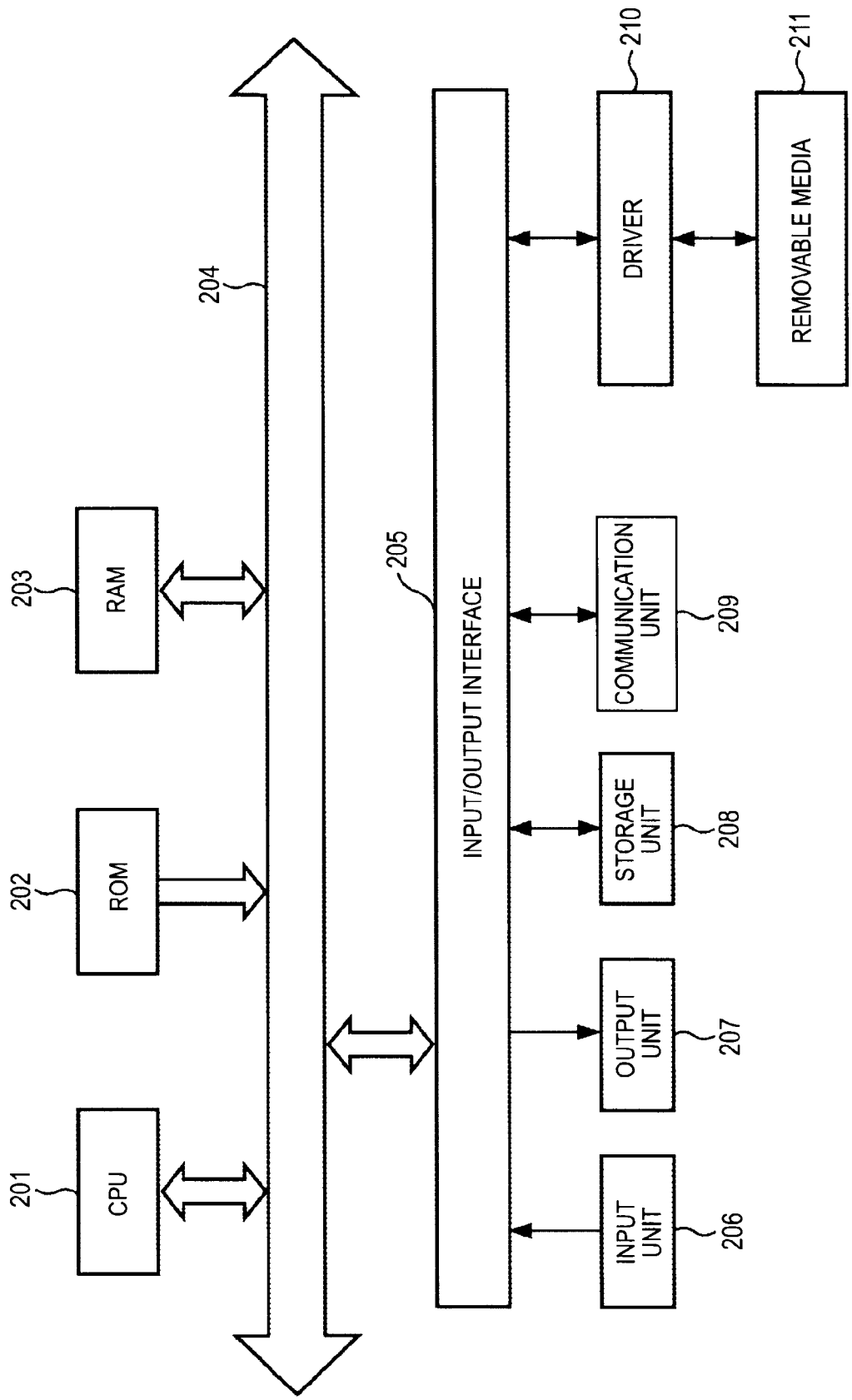
FIG. 15 is a block diagram showing a configuration of a personal computer.

FIG. 15 is a block diagram showing a configuration example of hardware of a computer which executes the above series of processing by programs.

In the computer, a CPU (Central Processing Unit) 201, a ROM (Read Only Memory) 202, a RAM (Random Access Memory) 203 are mutually connected by a bus 204.

An input/output interface 205 is further connected to the bus 204. An input unit 206, an output unit 207, a storage unit 208, a communication unit 209 and a drive 210 are connected to the input/output interface 205.

The input unit 206 includes a keyboard, a mouse, a microphone and the like. The output unit 207 includes a display, a speaker and the like. The storage unit 208 includes hard disk, a non-volatile memory and the like. The communication unit 209 includes a network interface and the like. The drive 210 drives removable media 211 such as a magnetic disc, an optical disc, a magneto-optic disc and a semiconductor memory.

In the computer configured as the above, the CPU 201 loads programs stored in, for example, the storage unit 208 to the RAM 203 through the input/output interface 205 and the bus 204 and executes the programs, thereby performing the above series of processing.

Programs executed by the computer (CPU 201) can be provided by being recorded in, for example, the removable media 211 as packaged media and the like. Programs can be also provided through wired or wireless transmission media such as local area networks, Internet and digital satellite broadcasting.

In the computer, programs can be installed in the storage unit 208 through the input/output interface 205 by mounting the removable media 211 on the drive 210. Programs can be installed in the storage unit 208 by being received by the communication unit 209 through wired or wireless transmission media. Additionally, programs can be installed in advance in the ROM 202 or the storage unit 208.

Programs executed by the computer may be programs processed in time series along the order explained in the present specification or may be programs in parallel or at necessary timing such as when calling is performed.

The embodiment of the invention is not limited to the above embodiments but can be variously modified within a scope not departing from the gist of the invention.

The present application contains subject matter related to that disclosed in Japanese Priority Patent Application JP 2009-244752 filed in the Japan Patent Office on Oct. 23, 2009, the entire contents of which is hereby incorporated by reference.

What is claimed is:

1. A data demodulator comprising:
a conversion means for converting an RLL code obtained by converting data in which information bits including specific bits are inserted at fixed intervals which is included in an input signal in accordance with a modulation table having variable-length conversion rules into data in accordance with a demodulation table corresponding to the modulation table;
a determination means for determining control segments for performing calculation intended by the information bits from the converted data;
a calculation means for executing calculation intended by the specific bit inserted in the control segment different from a calculation target with respect to the data of the control segment as the calculation target; and
a correction output means for selecting one of first data converted by the conversion means and second data obtained by converting the RLL code of the input signal corrected based on the calculation result in accordance with the demodulation table and outputting the data.

2. The data demodulator according to claim 1,
wherein the information bits are DSV bits and parity bits as specific bits inserted instead of part of the DSV bits.

3. The data demodulator according to claim 2,
wherein the determination means determines a DSV control segment and a parity calculation segment as the control segments,
the calculation means executes parity calculation intended by the parity bit inserted in the parity calculation segment which is subsequent to the parity calculation segment as the calculation target with respect to the data of the parity calculation segment as the calculation target and compares the parity bit with a value obtained by parity calculation.

4. The data demodulator according to claim 3,
wherein the correction output means includes
a correction means for correcting the input signal based on the calculation result by the calculation means;

another conversion means for converting the RLL code of the corrected input signal into the second data in accordance with the demodulation table; and a selection means for selecting the first data converted by the conversion means and the second data converted by the another conversion means.

5. The data demodulator according to claim 4, further comprising:

a detection means for detecting identification information indicating that the parity bits are inserted instead of part of the DSV bits from the input signal.

6. The data demodulator according to claim 4, further comprising:

a DSV calculation means for performing DSV calculation based on the DSV bits.

7. The data demodulator according to claim 5, further comprising:

a judgment means for judging that the parity bits are inserted instead of part of the DSV bits from probability that the comparison result occurs.

8. The data demodulator according to claim 7, further comprising:

a DSV calculation means for calculating a DSV of the DSV control segment, wherein the judgment means judges that the parity bits are inserted further by using the result of DSV calculation.

9. The data demodulator according to claim 8, wherein the determination means determines the DSV control segment and the parity calculation segment from a breakpoint between a last bit of a data pattern immediately preceding to the information bit on the basis of the information bit inserted in the data and a subsequent bit.

10. The data demodulator according to claim 9, further comprising:

a removal means for removing redundant bits from data selected by the selection means.

11. A data demodulation method of a data demodulator including a conversion means,
a determination means,
a calculation means and
a correction output means, the method comprising the steps of:

converting an RLL code obtained by converting data in which information bits including specific bits are inserted at fixed intervals which is included in an input signal in accordance with a modulation table having variable-length conversion rules into data in accordance with a demodulation table corresponding to the modulation table by the conversion means;

determining control segments for performing calculation intended by the information bits from the converted data by the determination means;

executing calculation intended by the specific bit inserted in the control segment different from a calculation target with respect to the data of the control segment as the calculation target by the calculation means; and selecting one of first data converted by the conversion means and second data obtained by converting the RLL code of the input signal corrected based on the calculation result in accordance with the demodulation table and outputting the data by the correction output means.

12. A non-transitory computer-readable medium including a program, which when executed by a computer, causes the computer to function as a conversion unit,
a determination unit,
a calculation unit; and
a correction output unit, wherein the conversion unit converts an RLL code obtained by converting data in which information bits including specific bits are inserted at fixed intervals which is included in an input signal in accordance with a modulation table having variable-length conversion rules into data in accordance with a demodulation table corresponding to the modulation table, the determination unit determines control segments for performing calculation intended by the information bits from the converted data, the calculation unit executes calculation intended by the specific bit inserted in the control segment different from a calculation target with respect to the data of the control segment as the calculation target and the correction output means selects one of first data converted by the conversion means and second data obtained by converting the RLL code of the input signal corrected based on the calculation result in accordance with the demodulation table and outputs the data.

13. A data demodulator comprising:

a conversion means for converting a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table;

a specific bit calculation means for executing calculation intended by the specific bits; and a DSV calculation means for executing DSV calculation based on the DSV bits.

14. The data demodulator according to claim 13, wherein the specific bit is a parity bit.

15. The data demodulator according to claim 14, further comprising:

a judgment means for judging that the parity bits are inserted instead of part of the DSV bits by using the result of the DSV calculation.

16. The data demodulator according to claim 15, further comprising:

a determination means for determining control segments for performing calculation intended by the information bits from the converted data; and a selection means for selecting one of first data converted by the conversion means and second data obtained by converting the code of the input signal corrected based on the calculation result of the specific bit in accordance with the demodulation table, wherein the specific bit calculation means executes calculation intended by the specific bit inserted in the control segment different from a calculation target with respect to the data of the control segment of the calculation target.

17. A data demodulation method of a data demodulator including a conversion means,
a specific bit calculation means, and
a DSV calculation means, the method comprising the steps of:

converting a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table by the conversion means;

executing calculation intended by the specific bits by the specific bit calculation means; and executing DSV calculation based on the DSV bits by the DSV calculation means.

18. A non-transitory computer-readable medium including a program, which when executed by a computer, causes the computer to function as a conversion unit, a specific bit calculation unit; and a DSV calculation unit, wherein the conversion unit converts a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table, the specific bit calculation unit executes calculation intended by the specific bits and the DSV calculation unit executes DSV calculation based on the DSV bits.

19. A data demodulator comprising:

a conversion unit configured to convert an RLL code obtained by converting data in which information bits including specific bits are inserted at fixed intervals which is included in an input signal in accordance with a modulation table having variable-length conversion rules into data in accordance with a demodulation table corresponding to the modulation table;

a determination unit configured to determine control segments for performing calculation intended by the information bits from the converted data;

a calculation unit configured to execute calculation intended by the specific bit inserted in the control segment different from a calculation target with respect to the data of the control segment as the calculation target; and a correction output unit configured to select one of first data converted by the conversion unit and second data obtained by converting the RLL code of the input signal corrected based on the calculation result in accordance with the demodulation table and output the data.

20. A data demodulator comprising:

a conversion unit configured to convert a code obtained by converting data in which information bits including DSV bits and specific bits having given intent instead of part of the DSV bits are inserted at fixed intervals which is included in an input signal in accordance with a modulation table into data in accordance with a demodulation table corresponding to the modulation table;

a specific bit calculation unit configured to execute calculation intended by the specific bits; and a DSV calculation unit configured to execute DSV calculation based on the DSV bits.

* * * * *